(12) United States Patent
Hanaoka et al.

(10) Patent No.: US 9,123,529 B2
(45) Date of Patent: Sep. 1, 2015

(54) METHOD FOR REPROCESSING SEMICONDUCTOR SUBSTRATE, METHOD FOR MANUFACTURING REPROCESSED SEMICONDUCTOR SUBSTRATE, AND METHOD FOR MANUFACTURING SOI SUBSTRATE

(75) Inventors: Kazuya Hanaoka, Fujisawa (JP); Shunsuke Kimura, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 94 days.

(21) Appl. No.: 13/523,011

(22) Filed: Jun. 14, 2012

(65) Prior Publication Data

US 2012/0329242 A1  Dec. 27, 2012

(30) Foreign Application Priority Data

Jun. 21, 2011 (JP) ................................. 2011-137283

(51) Int. Cl.
*H01L 21/00* (2006.01)
*H01L 21/02* (2006.01)
*H01L 21/306* (2006.01)
(Continued)

(52) U.S. Cl.
CPC .... *H01L 21/02032* (2013.01); *H01L 21/02238* (2013.01); *H01L 21/02255* (2013.01); *H01L 21/30604* (2013.01); *H01L 21/3105* (2013.01);
(Continued)

(58) Field of Classification Search
USPC ............. 438/458, 455, 483, 460, 471, 4, 689; 257/E21.214, E21.568
See application file for complete search history.

(56) References Cited

U.S. PATENT DOCUMENTS 3,640,806 A  2/1972  Watanabe et al.
4,731,516 A  3/1988  Noguchi et al.
(Continued)

FOREIGN PATENT DOCUMENTS

JP  2000-036585 A  2/2000
JP  2004-087606 A  3/2004

OTHER PUBLICATIONS

Antje Oltersdorf et al., "Anatytical Research of the Acid Etching Bath by Ion Chromatography", 23rd European Photovotaic Solar Energy Conference, Sep. 1-5, 2008, Valencia, Spain, pp. 1488-1492.*

*Primary Examiner* — Scott B Geyer
*Assistant Examiner* — Evren Seven
(74) *Attorney, Agent, or Firm* — Eric J. Robinson; Robinson Intellectual Property Law Office, P.C.

(57) ABSTRACT

A method suitable to reprocess a semiconductor substrate is provided. A semiconductor substrate in which a projection including a damaged semiconductor region and an insulating layer is provided in a peripheral portion of the semiconductor substrate is subjected to etching treatment for removing the insulating layer and to etching treatment for removing the damaged semiconductor region selectively with a non-damaged semiconductor region left using a mixed solution including nitric acid, a substance dissolving a semiconductor material included in the semiconductor substrate and oxidized by the nitric acid, a substance controlling a speed of oxidation of the semiconductor material and a speed of dissolution of the oxidized semiconductor material, and nitrous acid, in which the concentration of the nitrous acid is higher than or equal to 10 mg/l and lower than or equal to 1000 mg/l. Through these steps, the semiconductor substrate is reprocessed.

18 Claims, 9 Drawing Sheets

(51) Int. Cl.
*H01L 21/3105* (2006.01)
*H01L 21/311* (2006.01)
*H01L 21/762* (2006.01)

(52) U.S. Cl.
CPC .... *H01L 21/31111* (2013.01); *H01L 21/76254* (2013.01)

(56) References Cited

U.S. PATENT DOCUMENTS

| | | | |
|---|---|---|---|
| 5,266,152 A * | 11/1993 | Iwasaki et al. | 216/85 |
| 5,374,564 A | 12/1994 | Bruel | |
| 5,494,849 A | 2/1996 | Iyer et al. | |
| 5,559,043 A | 9/1996 | Bruel | |
| 5,840,616 A | 11/1998 | Sakaguchi et al. | |
| 5,969,398 A | 10/1999 | Murakami | |
| 6,010,579 A | 1/2000 | Henley et al. | |
| 6,110,845 A | 8/2000 | Seguchi et al. | |
| 6,127,702 A | 10/2000 | Yamazaki et al. | |
| 6,232,142 B1 | 5/2001 | Yasukawa | |
| 6,245,645 B1 | 6/2001 | Mitani et al. | |
| 6,251,754 B1 | 6/2001 | Ohshima et al. | |
| 6,271,101 B1 | 8/2001 | Fukunaga | |
| 6,284,628 B1 | 9/2001 | Kuwahara et al. | |
| 6,331,473 B1 | 12/2001 | Hirabayashi | |
| 6,335,231 B1 | 1/2002 | Yamazaki et al. | |
| 6,344,404 B1 | 2/2002 | Cheung et al. | |
| 6,372,609 B1 | 4/2002 | Aga et al. | |
| 6,380,046 B1 | 4/2002 | Yamazaki | |
| 6,388,652 B1 | 5/2002 | Yamazaki et al. | |
| 6,426,270 B1 | 7/2002 | Sakaguchi et al. | |
| 6,468,923 B1 | 10/2002 | Yonehara et al. | |
| 6,500,731 B1 | 12/2002 | Nakagawa et al. | |
| 6,521,492 B2 | 2/2003 | Miyasaka et al. | |
| 6,534,380 B1 | 3/2003 | Yamauchi et al. | |
| 6,548,382 B1 | 4/2003 | Henley et al. | |
| 6,596,610 B1 | 7/2003 | Kuwabara et al. | |
| 6,602,761 B2 | 8/2003 | Fukunaga | |
| 6,613,678 B1 | 9/2003 | Sakaguchi et al. | |
| 6,677,222 B1 | 1/2004 | Mishima et al. | |
| 6,686,623 B2 | 2/2004 | Yamazaki | |
| 6,720,640 B2 | 4/2004 | Kuwabara et al. | |
| 6,778,164 B2 | 8/2004 | Yamazaki et al. | |
| 6,803,264 B2 | 10/2004 | Yamazaki et al. | |
| 6,815,309 B2 | 11/2004 | Letertre et al. | |
| 6,875,633 B2 | 4/2005 | Fukunaga | |
| 6,927,148 B2 | 8/2005 | Ito | |
| 7,022,586 B2 | 4/2006 | Maleville et al. | |
| 7,064,049 B2 | 6/2006 | Ito et al. | |
| 7,084,016 B1 | 8/2006 | Yamazaki et al. | |
| 7,119,365 B2 | 10/2006 | Takafuji et al. | |
| 7,153,729 B1 | 12/2006 | Yamazaki et al. | |
| 7,176,525 B2 | 2/2007 | Fukunaga | |
| 7,183,177 B2 | 2/2007 | Al-Bayati et al. | |
| 7,199,024 B2 | 4/2007 | Yamazaki | |
| 7,256,776 B2 | 8/2007 | Yamazaki et al. | |
| 7,297,611 B2 | 11/2007 | Maleville | |
| 7,315,064 B2 | 1/2008 | Mitani et al. | |
| 7,354,844 B2 | 4/2008 | Endo et al. | |
| 7,364,984 B2 | 4/2008 | Endo et al. | |
| 7,387,944 B2 | 6/2008 | Tong et al. | |
| 7,402,520 B2 | 7/2008 | Donohoe et al. | |
| 7,405,136 B2 | 7/2008 | Delprat et al. | |
| 7,413,964 B2 | 8/2008 | Reynaud et al. | |
| 7,442,623 B2 | 10/2008 | Endo et al. | |
| 7,508,034 B2 | 3/2009 | Takafuji et al. | |
| 7,531,425 B2 | 5/2009 | Nakano et al. | |
| 7,531,428 B2 | 5/2009 | Dupont | |
| 7,579,654 B2 | 8/2009 | Couillard et al. | |
| 7,608,521 B2 | 10/2009 | Cites et al. | |
| 7,619,250 B2 | 11/2009 | Takafuji et al. | |
| 7,755,113 B2 | 7/2010 | Yamazaki et al. | |
| 7,759,233 B2 | 7/2010 | Forbes | |
| 7,763,541 B2 | 7/2010 | Okuda et al. | |
| 7,767,549 B2 | 8/2010 | Okuda et al. | |
| 7,767,583 B2 | 8/2010 | Ramappa et al. | |
| 7,781,308 B2 | 8/2010 | Isaka et al. | |
| 7,781,309 B2 | 8/2010 | Morita et al. | |
| 7,790,572 B2 | 9/2010 | Moriwaka | |
| 7,799,658 B2 | 9/2010 | Yamazaki | |
| 7,808,098 B2 | 10/2010 | Sugiyama et al. | |
| 7,825,007 B2 | 11/2010 | Yamazaki et al. | |
| 7,851,318 B2 | 12/2010 | Koyama et al. | |
| 7,867,877 B2 | 1/2011 | Morita et al. | |
| 2001/0003269 A1 * | 6/2001 | Wu et al. | 117/94 |
| 2001/0029072 A1 | 10/2001 | Kuwahara et al. | |
| 2001/0046746 A1 | 11/2001 | Yokokawa et al. | |
| 2002/0048844 A1 | 4/2002 | Sakaguchi | |
| 2002/0157790 A1 | 10/2002 | Abe et al. | |
| 2003/0087503 A1 | 5/2003 | Sakaguchi et al. | |
| 2003/0124815 A1 | 7/2003 | Henley et al. | |
| 2003/0170990 A1 | 9/2003 | Sakaguchi et al. | |
| 2004/0061176 A1 | 4/2004 | Takafuji et al. | |
| 2004/0104424 A1 | 6/2004 | Yamazaki | |
| 2004/0259328 A1 | 12/2004 | Ito et al. | |
| 2005/0009252 A1 | 1/2005 | Yamazaki et al. | |
| 2006/0148208 A1 | 7/2006 | Popov et al. | |
| 2006/0228846 A1 | 10/2006 | Endo et al. | |
| 2007/0063281 A1 | 3/2007 | Takafuji et al. | |
| 2007/0108510 A1 | 5/2007 | Fukunaga | |
| 2007/0141803 A1 | 6/2007 | Boussagol et al. | |
| 2007/0148914 A1 | 6/2007 | Morita et al. | |
| 2007/0173000 A1 | 7/2007 | Yamazaki | |
| 2007/0184632 A1 | 8/2007 | Yamazaki et al. | |
| 2007/0249139 A1 | 10/2007 | Gadkaree et al. | |
| 2007/0281399 A1 | 12/2007 | Cites et al. | |
| 2007/0291022 A1 | 12/2007 | Yamazaki et al. | |
| 2008/0124929 A1 | 5/2008 | Okuda et al. | |
| 2008/0153272 A1 | 6/2008 | Akiyama et al. | |
| 2008/0153307 A1 * | 6/2008 | Yamada et al. | 438/745 |
| 2008/0224274 A1 | 9/2008 | Yamazaki et al. | |
| 2008/0224940 A1 | 9/2008 | Sugiyama et al. | |
| 2008/0280420 A1 | 11/2008 | Yamazaki | |
| 2009/0081848 A1 | 3/2009 | Erokhin et al. | |
| 2009/0098704 A1 | 4/2009 | Ohnuma et al. | |
| 2009/0098710 A1 | 4/2009 | Yamazaki | |
| 2009/0111244 A1 | 4/2009 | Yamazaki et al. | |
| 2009/0111245 A1 | 4/2009 | Okabe et al. | |
| 2009/0115028 A1 | 5/2009 | Shimomura et al. | |
| 2009/0170287 A1 | 7/2009 | Endo et al. | |
| 2009/0209085 A1 | 8/2009 | Tamura et al. | |
| 2010/0022070 A1 | 1/2010 | Imahayashi | |
| 2010/0062546 A1 | 3/2010 | Endo et al. | |
| 2010/0273310 A1 | 10/2010 | Hanaoka et al. | |
| 2010/0330777 A1 | 12/2010 | Hanaoka | |
| 2010/0330778 A1 | 12/2010 | Hanaoka | |
| 2011/0053345 A1 | 3/2011 | Hanaoka et al. | |
| 2011/0065263 A1 | 3/2011 | Imahayashi et al. | |
| 2011/0086492 A1 * | 4/2011 | Ohnuma et al. | 438/455 |

* cited by examiner

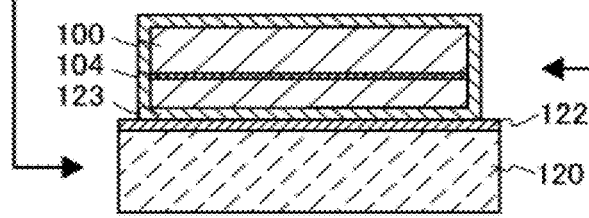
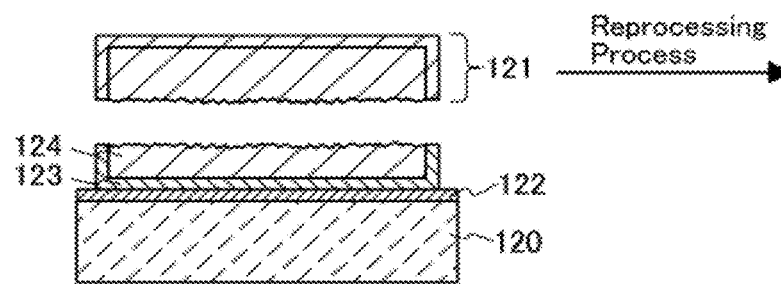
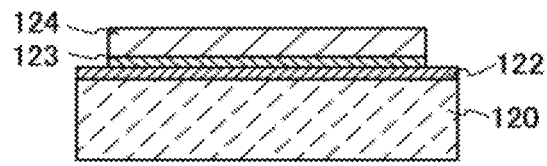

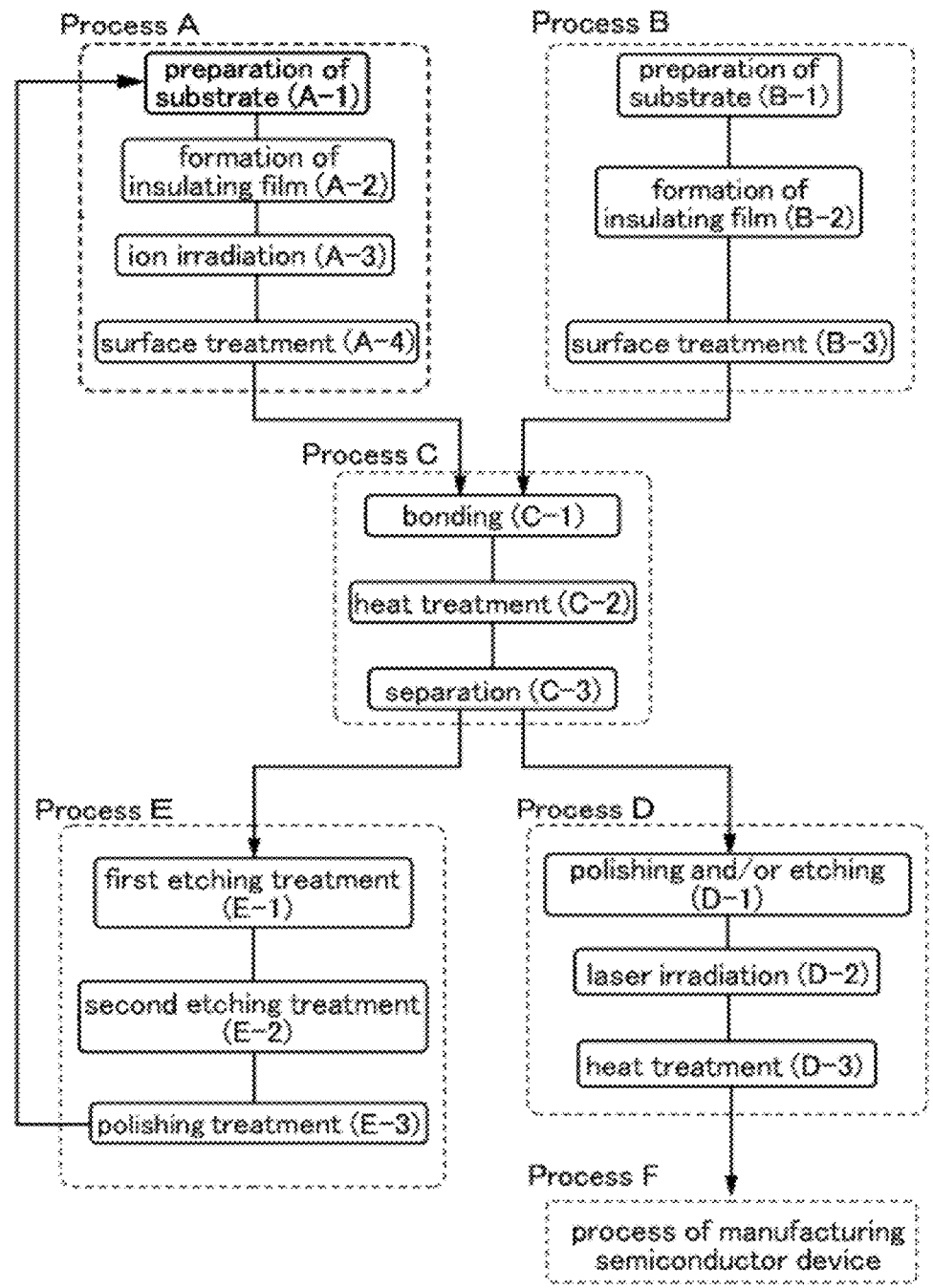

METHOD FOR REPROCESSING SEMICONDUCTOR SUBSTRATE, METHOD FOR MANUFACTURING REPROCESSED SEMICONDUCTOR SUBSTRATE, AND METHOD FOR MANUFACTURING SOI SUBSTRATE

BACKGROUND OF THE INVENTION

1. Field of the Invention

The invention to be disclosed relates to a method for reprocessing a semiconductor substrate. In addition, the invention to be disclosed relates to a method for manufacturing a reprocessed semiconductor substrate with the use of the method for reprocessing a semiconductor substrate, and relates to a method for manufacturing an SOI (silicon on insulator) substrate.

2. Description of the Related Art

In recent years, instead of a bulk silicon wafer, integrated circuits using an SOI (silicon on insulator) substrate that includes a thin single crystal silicon layer formed on an insulating surface have been developed. The characteristics of the thin single crystal silicon layer formed on the insulating surface make it possible to completely separate transistors formed in the integrated circuit from each other. Further, since fully-depleted transistors can be formed, a semiconductor integrated circuit with high added values such as high integration, high speed driving, and low power consumption can be realized.

As a method for manufacturing an SOI substrate, a hydrogen ion implantation separation method is known. The hydrogen ion implantation separation method is a method by which a single crystal silicon layer is obtained in the following manner: a single crystal silicon substrate (a bond substrate) into which hydrogen ions are implanted is bonded to another substrate (a base substrate) with an insulating layer provided between the substrates, and then the single crystal silicon substrate (the bond substrate) is separated along an ion implantation region by heat treatment. With the above hydrogen ion implantation separation method, an SOI substrate in which a single crystal silicon layer is provided over an insulating substrate such as a glass substrate can be manufactured (see Patent Document 1 as an example).

REFERENCE

Patent Document

[Patent Document 1] Japanese Published Patent Application No. 2004-87606

SUMMARY OF THE INVENTION

When a hydrogen ion implantation separation method is employed as a method for manufacturing an SOI substrate, a plurality of SOI substrates can be manufactured from one bond substrate; therefore, there is an advantage that cost for the bond substrate in manufacturing an SOI substrate can be reduced. This is because, when the bond substrate from which a single crystal silicon layer has been separated is subjected to reprocessing treatment, the used bond substrate can be reused for manufacturing another SOI substrate.

Here, a peripheral portion of the bond substrate, which is used for the above hydrogen ion implantation separation method, has a region called an edge roll off (E.R.O.) that is caused by chemical mechanical polishing (CMP) treatment in a manufacturing step of the SOI substrate. This region is formed when an edge of the bond substrate is polished with a polishing cloth. The edge roll off region of the bond substrate has a curved surface and a thickness smaller than that in a central region of the bond substrate.

When an SOI substrate is manufactured by the ion implantation separation method, a bond substrate and a base substrate are bonded to each other by a mechanism of intermolecular force or the Van der Waals force; therefore, surfaces to be bonded need to have a predetermined degree of planarity. It is natural that the bond substrate and the base substrate be not bonded in the edge roll off region where the surface planarity is not secured.

Thus, in the bond substrate from which the single crystal silicon layer has been separated, a single crystal silicon layer region and an insulating layer remain as a projection in the peripheral portion of the semiconductor substrate including the above edge roll off region. This projection becomes a problem in a stage of reprocessing treatment of the bond substrate. The difference in height between the projection and the other region (a region where the bonding is performed properly) is only about several hundred nanometers. However, in order to remove the projection by polishing the surface through CMP treatment and reprocess the bond substrate as a novel bond substrate, the substrate has to be removed part of the substrate, which has a thickness of about 10 μm in the thickness direction, so that there is a problem in that the number of times of reprocessing and using the bond substrate cannot be sufficiently secured.

In view of the above problem, one object of an embodiment of the disclosed invention in this specification is to provide a method suitable for reprocessing a semiconductor substrate. Another object of an embodiment of the present invention is to manufacture a reprocessed semiconductor substrate with the use of the method suitable for reprocessing a semiconductor substrate. Still another object of an embodiment of the present invention is to manufacture an SOI substrate with the use of the reprocessed semiconductor substrate.

An embodiment of the present invention is to remove a projection containing a single crystal silicon layer region and an insulating layer using a method capable of removing a semiconductor region damaged by ion addition or the like (hereinafter, also referred to as a damaged semiconductor region) preferentially, in other words, selectively. Further, the above method is used to manufacture a reprocessed semiconductor substrate, and an SOI substrate is manufactured using the reprocessed semiconductor substrate. Specifically, the following method can be applied.

Another embodiment of the present invention is a reprocessing method of a semiconductor substrate including the steps of subjecting a semiconductor substrate in which a projection including a damaged semiconductor region and the insulating layer is provided in a peripheral portion of the semiconductor substrate to etching treatment for removing an insulating layer and subjecting the semiconductor substrate in which the projection including the damaged semiconductor region and the insulating layer is provided in the peripheral portion of the semiconductor substrate to etching treatment for selectively removing the damaged semiconductor region with a non-damaged semiconductor region left using a mixed solution including acid and, a substance dissolving a semiconductor material included in the semiconductor substrate and oxidized by the nitric acid, a substance controlling a speed of oxidation of the semiconductor material and a speed of dissolution of the oxidized semiconductor material, and nitrous acid, in which a concentration of the nitrous acid is higher than or equal to 10 mg/l and lower than or equal to 1000 mg/l.

Further, another embodiment of the present invention is a reprocessing method of a semiconductor substrate comprising the steps of subjecting a semiconductor substrate in which a projection including a damaged semiconductor region and an insulating layer remain in a peripheral portion of the semiconductor substrate to etching treatment for removing the insulating layer by separating a part of the semiconductor substrate as a semiconductor layer through irradiation with ions and heat treatment and subjecting the semiconductor substrate in which the projection including the damaged semiconductor region and the insulating layer remain in the peripheral portion of the semiconductor substrate to etching treatment for selectively removing the damaged semiconductor region with a non-damaged semiconductor region left using a mixed solution including nitric acid, a substance dissolving a semiconductor material included in the semiconductor substrate and oxidized by the nitric acid, a substance controlling a speed of oxidation of the semiconductor material and a speed of dissolution of the oxidized semiconductor material, and nitrous acid, in which a concentration of the nitrous acid is higher than or equal to 10 mg/l and lower than or equal to 1000 mg/l.

In the above methods, the ion irradiation is preferably performed without mass separation. Further, the ion preferably includes an $H_3^+$ ion.

In the reprocessing method of the semiconductor substrate, hydrofluoric acid is preferably used as the substance dissolving the semiconductor material included in the semiconductor substrate and oxidized by the nitric acid, and acetic acid is preferably used as the substance controlling the speed of oxidation and the speed of dissolution of the semiconductor material.

Another embodiment of the present invention includes a manufacturing method of a reprocessed semiconductor substrate in which any one of the reprocessing methods of the semiconductor substrate described above is used, and the reprocessed semiconductor substrate is manufactured from the semiconductor substrate.

Still another embodiment of the present invention is a method for manufacturing an SOI substrate, in which ions are added to a reprocessed semiconductor substrate manufactured using the aforementioned method to form an embrittlement region therein, the reprocessed semiconductor substrate is bonded to a base substrate with an insulating layer provided therebetween, and the reprocessed semiconductor substrate is separated by a heat treatment, whereby a semiconductor layer is formed over the base substrate.

Note that in this specification and the like, an SOI substrate refers to a substrate in which a semiconductor layer is formed on an insulating surface, and is not limited to a structure where a silicon layer is provided over an insulating layer. For example, an SOI substrate includes a structure where a silicon layer is directly formed on a glass substrate, a structure where a silicon carbide layer is formed over an insulating layer, or the like.

Note that in this specification, in contrast to a single crystal semiconductor region in which atoms constituting a crystal are arranged in a spatially ordered manner, the damaged semiconductor region refers to a region partly including disordered arrangements (crystal structures) of atoms constituting crystals, crystal defects, crystal lattice distortion, and the like due to the introduction of ions and the like. Further, in this specification, a non-damaged semiconductor region refers to a single crystal semiconductor region with atoms constituting a crystal which are arranged in a spatially ordered manner, and is equivalent to a single crystal semiconductor region which is not subjected to the introduction of ions and the like.

According to an embodiment of the disclosed invention in this specification, a damaged semiconductor region can be selectively removed with respect to a non-damaged semiconductor region or a semiconductor region which is less damaged. Accordingly, the amount of loss of the semiconductor substrate due to removal by polishing or the like in reprocessing treatment of the semiconductor substrate can be reduced, and the number of times of reprocessing and using the semiconductor substrate can be increased.

Further, when a reprocessed semiconductor substrate is manufactured by the above method for reprocessing a semiconductor substrate, the productivity of the semiconductor substrate in the reprocessing treatment can be improved. Accordingly, cost for manufacturing the reprocessed semiconductor substrate can be reduced.

Furthermore, when an SOI substrate is manufactured using the above reprocessed semiconductor substrate, cost for manufacturing the SOI substrate can be reduced.

BRIEF DESCRIPTION OF THE DRAWINGS

In the accompanying drawings:

FIGS. 1A to 1E are cross-sectional views illustrating a method for manufacturing an SOI substrate;

FIG. 5 illustrates a manufacturing process of an SOI substrate;

FIGS. 7A1, 7B1, 7C1, 7D1, and 7E1 are images of a semiconductor substrate observed using a magic mirror system and FIGS. 7A2, 7B2, 7C2, 7D2, and 7E2 are optical microscope photographs.

FIGS. 8A1, 8B1, 8C1, 8D1, and 8E1 are images of a semiconductor substrate observed using a magic mirror system and FIGS. 8A2, 8B2, 8C2, 8D2, and 8E2 are optical microscope photographs.

DETAILED DESCRIPTION OF THE INVENTION

Embodiment 1

Figure 2A:
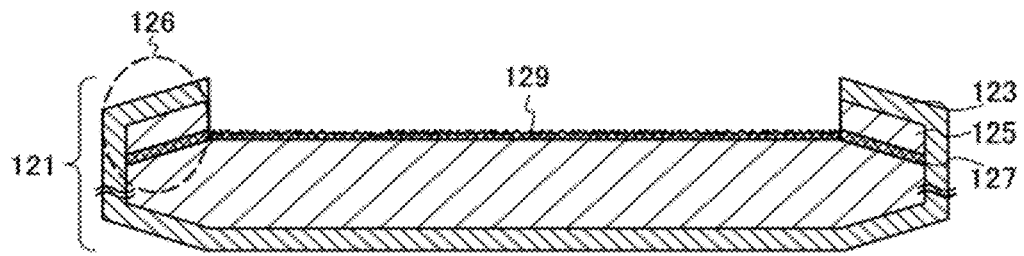
FIGS. 2A to 2D are cross-sectional views illustrating a method of reprocessing treatment for a semiconductor substrate.

In this embodiment, an example of a method for manufacturing an SOI substrate and an example of a method for reprocessing a semiconductor substrate which is used for manufacturing the SOI substrate will be described with reference to FIGS. 1A to 1E and FIGS. 2A to 2D.

<Process for Manufacturing SOI Substrate>

A process for manufacturing an SOI substrate is described with reference to FIGS. 1A to 1E. First, a base substrate 120 and a bond substrate are prepared (see FIGS. 1A and 1B).

As the base substrate 120, a substrate made of an insulator can be used. For example, variety of glass substrates used in the electronics industry, such as an aluminosilicate glass substrate, an aluminoborosilicate glass substrate, or a barium borosilicate glass substrate; a quartz substrate; a ceramic substrate, or a sapphire substrate can be given. Note that when the above glass substrate contains a large amount of boron oxide ($B_2O_3$), the heat resistance of glass is improved; and when it contains a larger amount of barium oxide (BaO) than boron oxide, more-practical heat-resistant glass can be obtained. Therefore, it is preferable that a glass substrate containing more BaO than $B_2O_3$ be used. Further, a substrate with high heat resistance may be used as the base substrate. Examples of a substrate with high heat resistance include a quartz substrate, a sapphire substrate, semiconductor substrates (e.g., a single crystal silicon substrate and a polycrystalline silicon substrate), and the like. Note that in this embodiment, a description is given of the case where a glass substrate is used as the base substrate 120. The use of a glass substrate as the base substrate 120, which realizes a larger size device and is inexpensive, can reduce costs.

A semiconductor substrate 100 can be used as the bond substrate. For example, a single crystal semiconductor substrate formed using an element of Group 14, such as a single crystal silicon substrate, a single crystal germanium substrate, or a single crystal silicon germanium substrate, can be used. Further, a compound semiconductor substrate using gallium arsenide, gallium arsenide phosphide, indium gallium arsenide, or the like can be used. Typical examples of commercially available silicon substrates are circular silicon substrates which are 5 inches (125 mm) in diameter, 6 inches (150 mm) in diameter, 8 inches (200 mm) in diameter, 12 inches (300 mm) in diameter, and 16 inches (400 mm) in diameter. Note that the shape of the semiconductor substrate 100 is not limited to a round shape and can be a rectangular shape or the like obtained by processing. Further, the semiconductor substrate 100 can be manufactured by the Czochralski (CZ) method or the floating zone (FZ) method.

Next, an embrittlement region 104 is formed at a predetermined depth from a surface of the semiconductor substrate 100. Then, the base substrate 120 and the semiconductor substrate 100 are bonded to each other with insulating layers 122 and 123 provided therebetween (see FIG. 1C).

In the above structure, the embrittlement region 104 can be formed by irradiating the insulating layer 123 formed over the semiconductor substrate 100 with hydrogen ion beams and introducing hydrogen ions into the semiconductor substrate 100.

Further, the insulating layers 122 and 123 can be formed using a single layer or a stacked layer of insulating layers such as a silicon oxide film, a silicon oxynitride film, a silicon nitride film, or a silicon nitride oxide film. These films can be formed by a thermal oxidation method, a CVD method, a sputtering method, or the like.

Note that in this specification and the like, the term oxynitride means a substance that contains more oxygen (atoms) than nitrogen (atoms). For example, a silicon oxynitride is a substance including oxygen, nitrogen, silicon, and hydrogen in ranges of 50 at. % to 70 at. %, 0.5 at. % to 15 at. %, 25 at. % to 35 at. %, and 0.1 at. % to 10 at. %, respectively. Further, the term nitride oxide means a substance that contained more nitrogen (atoms) than oxygen (atoms). For example, silicon nitride oxide is a substance including oxygen, nitrogen, silicon, and hydrogen in ranges of 5 at. % to 30 at. %, 20 at. % to 55 at. %, 25 at. % to 35 at. %, and 10 at. % to 30 at. %, respectively. Note that the above ranges are obtained by measurement using Rutherford backscattering spectrometry (RBS) or hydrogen forward scattering spectrometry (HFS). Moreover, the total of the percentages of the constituent elements does not exceed 100 at. %.

Next, by heat treatment or the like, the semiconductor substrate 100 is separated along the embrittlement region 104 into a semiconductor layer 124 and a separated semiconductor substrate 121, whereby the semiconductor layer 124 is formed over the base substrate 120 (see FIG. 1D). The separated semiconductor substrate 121 becomes a reprocessed semiconductor substrate through a reprocessing method of a semiconductor substrate described below and can be reused for manufacturing an SOI substrate. Note that, although not illustrated in FIGS. 1A to 1E, a projection exists in a peripheral portion of the separated semiconductor substrate 121.

When the heat treatment is performed, atoms added are separated out into microvoids which are formed in the embrittlement region 104 by ion beam irradiation, and internal pressure of the microvoids is increased. The increased pressure causes a crack in the embrittlement region 104, so that the semiconductor substrate 100 is separated along the embrittlement region 104. Since the insulating layer 122 is bonded to the insulating layer 123, the semiconductor layer 124 separated from the semiconductor substrate 100 is left over the base substrate 120 with the insulating layers 122 and 123 interposed therebetween.

After that, by subjecting the semiconductor layer 124 to surface treatment or the like, a flat semiconductor layer 124 is formed. As the surface treatment, there are irradiation treatment with a laser beam, etching treatment, and polishing treatment such as CMP, for example.

Through the above process, an SOI substrate in which the semiconductor layer 124 is provided over the base substrate 120 with the insulating layers 122 and 123 therebetween can be obtained.

<Process for Forming Reprocessed Bond Substrate>

Next, a process for reprocessing the separated bond substrate 121 is described with reference to FIGS. 2A to 2D.

A projection 126 exists in a peripheral portion of the semiconductor substrate 121 (see FIG. 2A). The projection 126 includes an insulating layer 123, an unseparated semiconductor region 125, and a semiconductor region 127 to which ions are added. Note that both the unseparated semiconductor region 125 and the semiconductor region 127 to which ions are added are damaged and include many crystal defects, voids, or the like, due to adding treatment of ions or the like in a manufacturing process of an SOI substrate. Therefore, the unseparated semiconductor region 125 and the semiconductor region 127 to which ions are added can be collectively referred to as a damaged semiconductor region.

The above projection 126 includes an edge roll off region of the semiconductor substrate. The edge roll off region is caused by surface treatment (CMP treatment) of the semiconductor substrate. The CMP treatment is a treatment for flattening a surface of an object with a combination of chemical and mechanical actions. Since the thickness of the semiconductor substrate in the vicinity of the edge roll off region is smaller than that of a central region of the semiconductor substrate before the semiconductor layer is separated, bonding is not performed in the edge roll off region in manufacturing an SOI substrate. As a result, the projection 126 is left in the edge roll off region of the semiconductor substrate 121.

Note that a semiconductor region 129 to which ions are added exists in a region of the semiconductor substrate 121, other than the projection 126, (especially in a region surrounded by the above edge roll off region). The semiconductor region 129 to which ions are added is formed in such a manner that a region to which ions are added, which is formed in the manufacturing process of the SOI substrate, is left in the semiconductor substrate 121 after the semiconductor layer is separated.

Here, the semiconductor region 129 to which ions are added is sufficiently thin as compared to the semiconductor region in the projection 126 (the semiconductor region 125 and the semiconductor region 127 to which ions are added). Further, the semiconductor region 129 to which ions are added includes many crystal defects or the like generated due to damage by ions. Therefore, like the semiconductor region 125 and the semiconductor region 127 to which ions are added, the semiconductor region 129 to which ions are added can also be referred to as a damaged semiconductor region.

Figure 2B:
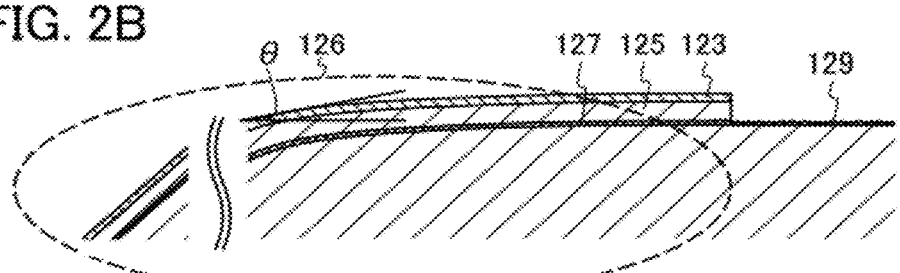

FIG. 2B illustrates a schematic view in which the projection 126 is enlarged. The projection 126 includes a region corresponding to the edge roll off region and a region corresponding to a chamfer portion. In this embodiment, the edge roll off region refers to a set of points at which an angle θ between a tangent plane of a surface of the projection 126 and a reference surface is 0.5° or less. Here, as the reference surface, a plane parallel to a front surface or a back surface of the semiconductor substrate is employed.

Further, when the chamfer portion is a region at a distance shorter than 0.2 mm from the end of the substrate, the edge roll off region can be defined as a region which is inside the chamfer portion and in which bonding is not performed. Specifically, for example, a region at a distance longer than or equal to 0.2 mm and shorter than or equal to 0.9 mm from the end of the substrate can be referred to as the edge roll off region.

Note that because the chamfer portion does not affect the bonding between the base substrate and the bond substrate, the planarity of the chamfer portion does not matter in the reprocessing treatment of the substrate. On the other hand, the vicinity of the edge roll off region has an influence on the bonding between the base substrate and the bond substrate. Therefore, depending on the planarity of the edge roll off region, a reprocessed semiconductor substrate cannot be used in a manufacturing process of an SOI substrate in some cases. From such a reason, to remove the projection 126 in the edge roll off region to improve the planarity of the semiconductor substrate is quite important in the reprocessing treatment of the semiconductor substrate.

The reprocessing treatment of the semiconductor substrate includes not less than two etching treatments: an etching treatment for removing the insulating layer 123 (hereinafter, referred to as a first etching treatment) and an etching treatment for removing the damaged semiconductor region (hereinafter, referred to as a second etching treatment). These are described in detail below.

Figure 2C:
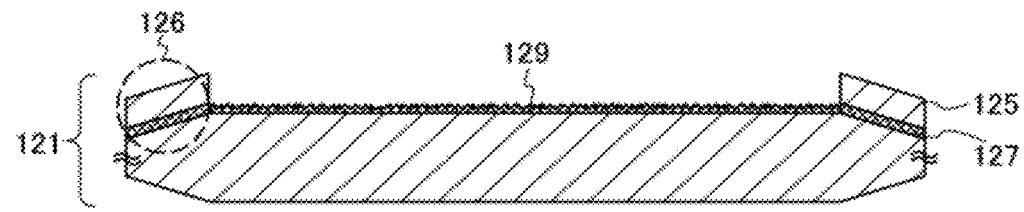

First, the first etching treatment is described with reference to FIG. 2C. As described above, the first etching treatment is etching treatment for removing the insulating layer 123 from the semiconductor substrate 121.

Here, the insulating layer 123 can be removed by wet etching treatment using a solution containing hydrofluoric acid as an etchant. As the solution containing hydrofluoric acid, a mixed solution containing hydrofluoric acid, ammonium fluoride, and a surfactant (e.g., product name: LAL 500, produced by Stella Chemifa Corporation) or the like is preferably used. Alternatively, a 5% hydrofluoric acid solution may be used. The wet etching treatment is preferably performed for approximately 180 seconds to 300 seconds.

Since wet etching treatment can be performed in such a manner that the semiconductor substrate 121 is soaked in a solution in a treatment tank, a plurality of semiconductor substrates 121 can be processed at once. Accordingly, efficiency of the reprocessing treatment can be increased.

Further, as a first etching treatment, dry etching treatment may be performed. Alternatively, wet etching treatment and dry etching treatment may be used in combination. For the dry etching treatment, a parallel plate reactive ion etching (RIE) method, an inductively coupled plasma (ICP) etching method, or the like can be used.

Next, the second etching treatment is described. In the second etching treatment, the damaged semiconductor regions, that is, the unseparated semiconductor region 125 and the semiconductor region 127 to which ions are added, which are included in the projection 126, and the semiconductor region 129 to which ions are added, are selectively removed.

More specifically, wet etching treatment is performed using, as an etchant, a mixed solution which includes nitric acid which is a substance that oxidizes a semiconductor material, a substance that dissolves the oxidized semiconductor material by the nitric acid, a substance that controls the speed of oxidation of the semiconductor material and the speed of dissolution of the oxidized semiconductor material, and nitrous acid which functions as an autocatalyst. The concentration of nitrous acid in a mixed solution is preferably higher than or equal to 10 mg/l and lower than or equal to 1000 mg/l, more preferably higher than or equal to 50 mg/l and lower than or equal to 300 mg/l.

The second etching treatment is preferably performed for approximately 30 seconds to 120 seconds. For example, in the case where a mixed solution containing hydrofluoric acid, nitric acid, and acetic acid, which is described below, at a volume ratio of 1:2:10 is used, the second etching treatment is preferably performed for approximately 45 seconds to 105 seconds. In addition, the temperature of the mixed solution is preferably approximately 10° C. to 40° C., for example, 30° C.

Here, as the substance dissolving the oxidized semiconductor material by the nitric acid, hydrofluoric acid is preferably used. Moreover, as the substance controlling the speed of oxidation of the semiconductor material and the speed of dissolution of the oxidized semiconductor material, acetic acid is preferably used.

In the case where a mixed solution of nitric acid (concentration of 70 weight %), hydrofluoric acid (concentration of 50 weight %), acetic acid (concentration of 97.7 weight %), and nitrous acid is used as an etchant, it is preferable that the volume of nitric acid be more than 0.01 times and less than one time as large as that of acetic acid and be more than 0.1 times and less than 100 times as large as that of hydrofluoric acid, and the volume of hydrofluoric acid be more than 0.01 times and less than 0.5 times as large as that of acetic acid. For example, it is preferable that the volume ratio of hydrofluoric acid, nitric acid, and acetic acid be 1:2:10 (the concentration of nitrous acid is higher than or equal to 10 mg/l and lower than or equal to 1000 mg/l).

As described above, nitric acid contained in a mixed solution oxidizes a material included in a semiconductor substrate. For example, in the case where a silicon wafer is used as a semiconductor substrate, nitric acid oxidizes silicon, and this chemical reaction can be represented as the following formula (1).

$$3Si + 4HNO_3 \rightarrow 3SiO_2 + 2H_2O + 4NO \quad (1)$$

Here, the formula (1) includes elementary process represented by the following formulae (2) and (3).

$$HNO_2 + HNO_3 + H_2O \rightarrow 2HNO_2 + 2OH^- + 2h^+ \quad (2)$$

$$Si + 4h^+ + 2H_2O \rightarrow SiO_2 + 4H^+ \quad (3)$$

In the formula (2), $HNO_2$ functions as an autocatalyst for promoting its synthesis, and the amount of $HNO_2$ is increased when the reaction progresses. Further, with the increase in the amount of $HNO_2$, the oxidation rate of silicon is increased. In etching of a silicon wafer, the reaction occurs by dissolving oxidized silicon ($SiO_2$); therefore, the oxidation rate of silicon is increased, whereby the etching rate of silicon is also increased.

Note that here, "etching rate" means the etching amount (amount etched) per unit time. That is, "a film whose etching rate is high" represents a film which is easily etched, and "a film whose etching rate is low" represents a film which is difficult to be etched. In addition, "to obtain etching selectivity" means that, for example, a layer A and a layer B are etched under the condition where there is a sufficient difference between the etching rate of the layer A and the etching rate of the layer B.

For example, when the concentration of nitrous acid in a mixed solution is low, a reaction represented by the above formula (2) is less likely to occur in initial state; therefore, the etching amount with respect to the etching time changes slightly. When the concentration of $HNO_2$ is greater than or equal to a predetermined value, the reaction rate in the formula (2) is increased at an accelerated pace in proportion to the concentration of $HNO_2$. Therefore, the etching rate of a mixed solution which has been left for a certain period is different from that in an initial state, and thus a stable etching rate cannot be easily obtained in the case where a substrate is continuously processed.

On the other hand, in the mixed solution described in this embodiment, the concentration of nitrous acid is high (e.g., higher than or equal to 10 mg/l, preferably higher than or equal to 50 mg/l); therefore, reaction in the formula (2) is performed stably even in initial state. As a result, the etching amount with respect to the etching time can be increased linearly, so that stabilization of the etching rate can be achieved. Therefore, a substrate can be processed continuously, so that productivity can be improved. Further, in the mixed solution described in this embodiment, the etching rate is high; therefore, the treatment time can be shortened by performing reprocessing treatment using the mixed solution.

Note that in order that the concentration of nitrous acid in the mixed solution be high, a dummy substrate is subjected to wet etching treatment using, as an etchant, a mixed solution which includes nitric acid, a substance that dissolves the semiconductor material oxidized by the nitric acid, and a substance that controls the speed of oxidation of the semiconductor material and the speed of dissolution of the oxidized semiconductor material, for example.

Further, when the concentration of nitrous acid in the mixed solution is set too high, dissolution of the semiconductor material by a substance that dissolves the semiconductor material oxidized by the nitric acid is a rate-controlling factor of wet etching; therefore, the concentration of nitrous acid is set lower than or equal to 1000 mg/l, preferably lower than or equal to 300 mg/l.

Crystal defects, voids, and the like formed due to addition of ions exist in the damaged semiconductor region, and an etchant penetrates easily thereinto. Accordingly, in the damaged semiconductor region, etching progresses not only from a surface but also from the inside.

Specifically, the etching tends to progress in such a manner that a deep hole is formed in a direction perpendicular to the plane surface of the substrate and then the hole is expanded. In other words, in the damaged semiconductor region, etching treatment progresses at a higher etching rate than in a less-damaged semiconductor region or the non-damaged semiconductor region.

Note that in this specification and the like, the less-damaged semiconductor region refers to a semiconductor region in which the degree of damage is relatively low as compared to that of the unseparated semiconductor region 125, the semiconductor region 127 to which ions are added, the semiconductor region 129 to which ions are added, or the like.

The etching rate of the damaged semiconductor region in the case where the etchant is used is 1.7 times or more as high as that of the non-damaged semiconductor region (or the less-damaged semiconductor region). That is, the etching selectivity of the damaged semiconductor region to the non-damaged semiconductor region (or the less-damaged semiconductor region) becomes 1.7 or higher.

In this manner, when the wet etching treatment is performed using, as an etchant, the mixed solution which includes nitric acid which is the substance that oxidizes the semiconductor material, the substance that dissolves the oxidized semiconductor material by the nitric acid, the substance that controls the speed of oxidation of the semiconductor material and the speed of dissolution of the oxidized semiconductor material, and nitrous acid which functions as an autocatalyst, the damaged semiconductor region can be selectively removed.

Accordingly, in reprocessing treatment of a substrate, the amount of loss of the substrate due to removal by polishing or the like can be significantly smaller than ever before, and the number of times of reprocessing and using the substrate can be increased. Further, by the wet etching treatment, a plurality of semiconductor substrates 121 can be processed at one time; therefore, efficiency of the reprocessing treatment of the substrate can be increased. Furthermore, since the second etching treatment can be performed in a short time compared to the CMP treatment, efficiency of the reprocessing treatment of the substrate can be increased also for this reason.

Further, the etchant used for a reprocessing method of the semiconductor substrate described in this embodiment includes nitrous acid as an autocatalyst, whereby the etching rate can be increased compared to a mixed solution without nitrous acid or with low-concentration nitrous acid; therefore, etching treatment can be performed in an extremely short time. Moreover, nitrous acid with high concentration (e.g., higher than or equal to 10 mg/l) is included, whereby reprocessing treatment of a substrate can be performed in a stable etching rate. Therefore, variation in the reprocessed semiconductor substrate can be reduced. Moreover, because of having the stable etching rate, the substrate can be processed continuously. Therefore, productivity of the reprocessed semiconductor substrate can be improved.

Note that the thickness of the damaged semiconductor region in the projection 126 (the semiconductor region 125 and the semiconductor region 127 to which ions are added) is largely different from that of the damaged semiconductor region in the other region (the semiconductor region 129 to which ions are added). Therefore, the etching selectivity of the projection 126 (the peripheral portion) to the other region (the central portion) is not uniform during the second etching treatment.

Specifics are described below. Immediately after the second etching treatment is started, the damaged semiconductor region is first etched both in the projection 126 and in the other region; thus, the etching selectivity is approximately 1. After the damaged semiconductor region other than the projection 126 (the semiconductor region 129 to which ions are added) is removed, the less-damaged semiconductor region or the non-damaged semiconductor region is exposed in damaged semiconductor region other than the projection 126. Thus, the damaged semiconductor region in the projection 126 is preferentially removed, and the etching selectivity becomes 1.7 or higher. After the damaged semiconductor region in the projection 126 (the semiconductor region 125 and the semiconductor region 127 to which ions are added) is etched to be removed, the less-damaged semiconductor region or the non-damaged semiconductor region is exposed also in the projection 126; thus, the etching selectivity returns to approximately 1.

In this manner, since the etching selectivity varies during the second etching treatment, the etching can be finished in consideration of the change of the selectivity. For example, by stopping the etching treatment at the stage where the etching selectivity is reduced to lower than 1.2, the damaged semiconductor region can be removed while the unnecessary over etching by the second etching treatment is reduced.

Note that the etching selectivity may be a value (a finite difference value) obtained by comparing each of the amounts of thickness of the projection 126 (the peripheral portion) and the other region (the central portion), which are reduced in a predetermined time (e.g., 30 seconds or 1 minute) or may be a value (a differential value) obtained by comparing the amounts of thickness reduced in an instant.

Figure 2D:
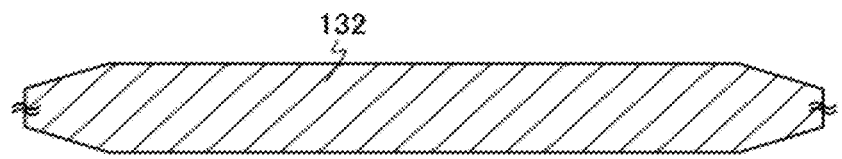

In the above manner, the semiconductor substrate 121 is reprocessed, and the reprocessed semiconductor substrate 132 is completed as illustrated in FIG. 2D.

Although most part of the semiconductor region 129 to which ions are added is removed by the above second etching treatment, part thereof is left in some cases. In such a case, other surface treatment is preferably performed after the second etching treatment so that the semiconductor region 129 to which ions are added is completely removed. As the surface treatment, polishing treatment typified by CMP treatment, laser beam irradiation processing, and the like are given.

In addition, the polishing treatment or the laser beam irradiation treatment may be performed a plurality of times. The order of the treatment steps can be determined as appropriate without limitation. Irradiation treatment with lamp light may be performed instead of the irradiation with a laser beam.

As described in this embodiment, after an insulating layer is removed through the first etching treatment, the second etching treatment is performed using the mixed solution which includes nitric acid which is the substance that oxidizes the semiconductor material, the substance that dissolves the oxidized semiconductor material by the nitric acid, the substance that controls the speed of oxidation of the semiconductor material and the speed of dissolution of the oxidized semiconductor material, and nitrous acid which functions as an autocatalyst, so that the damaged semiconductor region remaining in the periphery of the semiconductor substrate can be selectively removed. Therefore, the amount of loss of the substrate due to removal by polishing or the like can be significantly smaller than ever before, and the number of times of reprocessing and using the semiconductor substrate can be increased.

The structure described in this embodiment can be used in appropriate combination with the structure described in any of the other embodiments.

Embodiment 2

In a method for manufacturing an SOI substrate of this embodiment, an SOI substrate is manufactured by bonding a semiconductor layer separated from a semiconductor substrate which is a bond substrate to a base substrate. The semiconductor substrate from which the semiconductor layer has been separated is subjected to reprocessing treatment and reused as a bond substrate. An example of a method for manufacturing the SOI substrate of this embodiment will be described below with reference to FIGS. 3A to 3C, FIGS. 4A to 4C, and a manufacturing process chart of an SOI substrate of FIG. 5.

First, a process of forming an embrittlement region 104 in a semiconductor substrate 100 to prepare for bonding with a base substrate 120 is described. This process relates to treatment for the semiconductor substrate 100 and corresponds to Process A in FIG. 5.

Figure 3A:
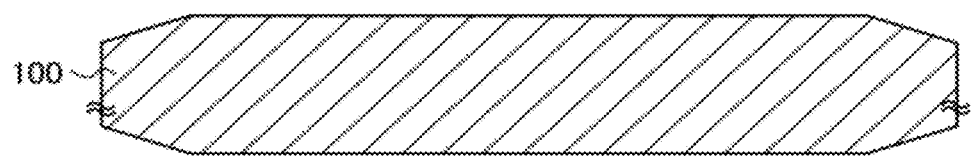
FIGS. 3A to 3C are cross-sectional views illustrating a method for manufacturing an SOI substrate.

First, the semiconductor substrate 100 is prepared (see FIG. 3A and the step A-1 in FIG. 5). As the semiconductor substrate 100, for example, a single crystal semiconductor substrate or a polycrystalline semiconductor substrate of silicon or the like can be used. Typical examples of commercially available silicon substrates are circular silicon substrates which are 5 inches (125 mm) in diameter, 6 inches (150 mm) in diameter, 8 inches (200 mm) in diameter, 12 inches (300 mm) in diameter, and 16 inches (400 mm) in diameter. Further, in a peripheral portion of a silicon substrate, there is a chamfer portion for preventing chipping or cracking as illustrated in FIG. 3A. Note that the shape is not limited to the circular shape, and a silicon substrate which is processed into a rectangular shape or the like can also be used. The case in which a rectangular single crystal silicon substrate is used as the semiconductor substrate 100 is described below.

Note that a surface of the semiconductor substrate 100 is preferably cleaned using a sulfuric acid/hydrogen peroxide mixture (SPM), an ammonium hydroxide/hydrogen peroxide mixture (APM), a hydrochloric acid/hydrogen peroxide mixture (HPM), dilute hydrofluoric acid (DHF), ozone water, or the like, as appropriate. Further, diluted hydrofluoric acid and ozone water may be discharged alternately to clean the surface of the semiconductor substrate 100.

Figure 3B:
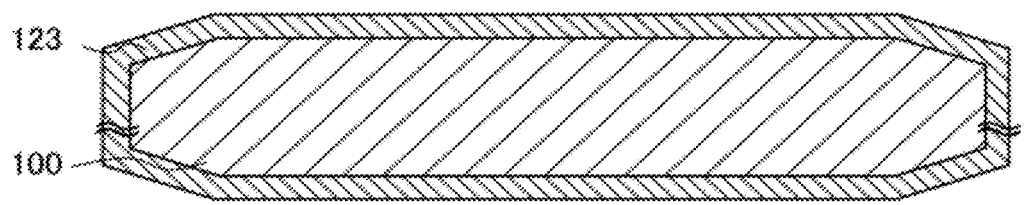
Figure 3C:
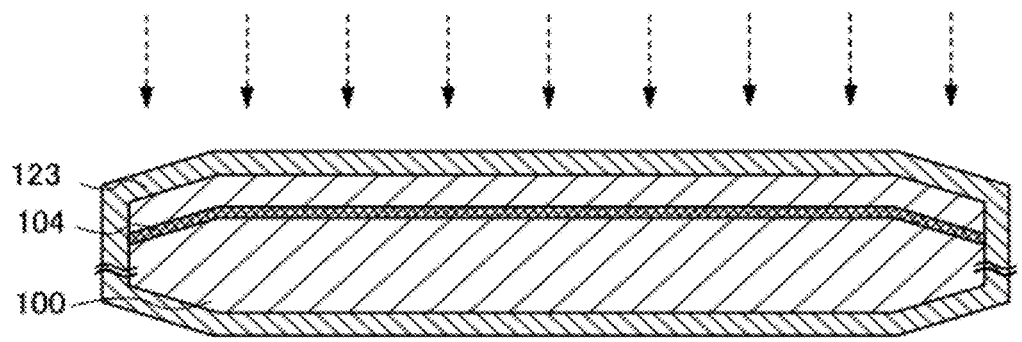

After the surface of the semiconductor substrate 100 is cleaned, an insulating layer 123 is formed over the semiconductor substrate 100 (see FIG. 3B and the step A-2 in FIG. 5). The insulating layer 123 may be formed using a single layer or a stacked layer including a plurality of insulating films. The insulating layer 123 can be formed using an insulating film which contains silicon as a component, such as a silicon oxide film, a silicon nitride film, a silicon oxynitride film, or a silicon nitride oxide film. In this embodiment, the case of using a silicon oxide film as the insulating layer 123 is described as an example.

In the case of using silicon oxide for the insulating layer 123, the insulating layer 123 can be formed using a mixed gas of silane and oxygen, a mixed gas of tetraethoxysilane (TEOS) (chemical formula: $Si(OC_2H_5)_4$) and oxygen, or the like by a vapor deposition method such as thermal CVD, plasma CVD, atmospheric pressure CVD, or bias ECRCVD. In this case, a surface of the insulating layer 123 may be densified by oxygen plasma treatment.

Alternatively, a silicon oxide layer formed by a chemical vapor deposition method using an organosilane gas may be used as the insulating layer 123. As an organosilane gas, a silicon-containing compound such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), or trisdimethylaminosilane ($SiH(N(CH_3)_2)_3$) can be used.

Further alternatively, the insulating layer 123 can be formed using an oxide film obtained by oxidizing the semiconductor substrate 100. Thermal oxidation treatment for forming the oxide film may be dry oxidation, and may be performed in an oxidation atmosphere to which a halogen-containing gas is added. As the halogen-containing gas, one or plural kinds of gases selected from HCl, HF, $NF_3$, HBr, $Cl_2$, $ClF_3$, $BCl_3$, $F_2$, $Br_2$, and the like can be used. Note that the insulating layer 123 is formed to cover the semiconductor substrate 100 in FIG. 3B; however, this embodiment is not limited to this structure. In the case where the insulating layer 123 is formed by a CVD method or the like on the semiconductor substrate 100, the insulating layer 123 may be formed on only one of the surfaces of the semiconductor substrate 100.

As an example of formation conditions of the thermal oxide film, heat treatment is performed at higher than or equal to 700° C. and lower than or equal to 1100° C. (typically at approximately 950° C.) in an atmosphere containing HCl at a rate of 0.5 volume % to 10 volume % (preferably 3 volume %) with respect to oxygen. Treatment time may be 0.1 to 6 hours, preferably, 0.5 to 1 hour. The thickness of the oxide film to be formed can be set in the range of 10 nm to 1100 nm (preferably 50 nm to 150 nm), for example, 100 nm.

By such thermal oxidation treatment in an atmosphere containing a halogen element, the oxide film can contain the halogen element. By containing the halogen element at a concentration of $1 \times 10^{17}$ atoms/cm$^3$ to $1 \times 10^{21}$ atoms/cm$^3$, the oxide film captures heavy metal that is an extrinsic impurity (e.g., Fe, Cr, Ni, or Mo), so that contamination of the semiconductor layer to be formed later can be prevented.

Further, the insulating layer 123 containing a halogen element such as chlorine can serve to getter impurities (e.g., mobile ions of Na or the like) which adversely affect the semiconductor substrate 100. Specifically, by heat treatment which is performed after the insulating layer 123 is formed, impurities contained in the semiconductor substrate 100 are separated out to the insulating layer 123, reacted with the halogen atom (e.g., a chlorine atom), and captured. Accordingly, the impurities captured in the insulating layer 123 can be fixed and prevented from contaminating the semiconductor substrate 100. Further, when the insulating layer 123 is bonded to a glass substrate, the insulating layer 123 can also function as a film for fixing impurities such as Na contained in glass.

In particular, the inclusion of halogen such as chlorine in the insulating layer 123 by heat treatment in an atmosphere containing halogen is effective in removing contaminants of the semiconductor substrate when cleaning of the semiconductor substrate 100 is insufficient or when the semiconductor substrate 100 is repeatedly subjected to reprocessing treatment and used.

Moreover, the halogen element contained in the oxidation treatment atmosphere terminates defects on the surface of the semiconductor substrate 100; as a result, the local level density of an interface between the oxide film and the semiconductor substrate 100 can be reduced.

The halogen element contained in the insulating layer 123 makes distortions in the insulating layer 123. As a result, water absorption rate of the insulating layer 123 is improved and diffusion rate of water is increased. That is, when water is present on the surface of the insulating layer 123, the water present on the surface can be rapidly absorbed and diffused into the insulating layer 123.

In the case of using, as a base substrate, a glass substrate which contains impurities which decrease reliability of a semiconductor device, such as alkali metal or alkaline earth metal, the insulating layer 123 preferably includes at least one or more films which can prevent the impurities in the base substrate from diffusing into the semiconductor layer of the SOI substrate. As such a film, a silicon nitride film, a silicon nitride oxide film, and the like can be given. With such a film included in the insulating layer 123, the insulating layer 123 can function as a barrier film (also referred to as a blocking film).

For example, a silicon nitride film can be formed using a mixed gas of silane and ammonia by a vapor deposition method such as a plasma CVD method. In addition, for example, a silicon nitride oxide can be formed using a mixed gas of silane and ammonia, or silane and dinitrogen monoxide by a vapor deposition method such as a plasma CVD method.

For example, in the case of forming a barrier film having a single-layer structure as the insulating layer 123, the insulating layer 123 can be formed using a silicon nitride film or a silicon nitride oxide film with a thickness of greater than or equal to 15 nm and less than or equal to 300 nm.

In the case of forming a two-layer barrier film as the insulating layer 123, the upper layer is formed using an insulating film with a high barrier property. The upper layer of the insulating film can be formed using, for example, a silicon nitride film or a silicon nitride oxide film with a thickness of 15 nm to 300 nm. These films have a high blocking effect for preventing impurity diffusion, but their internal stress is also high. Therefore, as an insulating film of a lower layer that is in contact with the semiconductor substrate 100, it is preferable to select a film that has an effect of relieving the stress of an insulating film of the upper layer. Examples of the insulating film with an effect of relieving the stress of the upper insulating film include a silicon oxide film, a silicon oxynitride film, and a thermally oxidized film formed by thermally oxidizing the semiconductor substrate 100. The thickness of the lower insulating film can be greater than or equal to 5 nm and less than or equal to 200 nm.

For example, in order for the insulating layer 123 to function as a barrier film, the insulating layer 123 is preferably formed using a combination of a silicon oxide film and a silicon nitride film, a silicon oxynitride film and a silicon nitride film, a silicon oxide film and a silicon nitride oxide film, a silicon oxynitride film and a silicon nitride oxide film, or the like.

Next, the semiconductor substrate 100 is irradiated with an ion beam containing ions accelerated by an electric field through the insulating layer 123, as indicated by arrows. Thus, the embrittlement region 104 is formed in a region at a desired depth from the surface of the semiconductor substrate 100 (see FIG. 3C and the step A-3 in FIG. 5). The depth at which the embrittlement region 104 is formed is substantially the same as the average penetration depth of the ions, and can be adjusted by the acceleration energy of the ion beam and the incident angle of the ion beam. In addition, the acceleration energy can be adjusted by acceleration voltage or the like. The thickness of a semiconductor layer 124 which is separated from the semiconductor substrate 100 later is determined by the depth at which the embrittlement region 104 is formed. The depth at which the embrittlement region 104 is formed can be set in the range of, for example, greater than or equal to 10 nm and less than or equal to 500 nm, preferably greater than or equal to 50 nm and less than or equal to 200 nm from the surface of the semiconductor substrate 100; for example, the depth is preferably approximately 100 nm from the surface of the semiconductor substrate 100. Note that irradiation with ion beams is performed after formation of the insulating layer 123 in this embodiment; however, without being limited thereto, the irradiation with ion beams may be performed before the formation of the insulating layer 123.

The embrittlement region 104 can be formed by ion doping treatment. The ion doping treatment can be performed with an ion doping apparatus. A typical example of an ion doping apparatus is a non-mass-separation apparatus with which an object placed in a chamber is irradiated with all ion species generated by excitation of a process gas into plasma. The non-mass-separation apparatus is an apparatus with which an object is irradiated with ion beams containing all ion species without mass separation of ion species in plasma.

Main components of an ion doping apparatus are as follows: a chamber in which an object is placed; an ion source for generating desired ions; and an acceleration mechanism for acceleration of ions for irradiation therewith. The ion source includes a gas supply device which supplies a source gas for generating desired ion species, an electrode for exciting the source gas to generate plasma, and the like. As the electrode for generating plasma, a capacitively-coupled high-frequency discharge electrode, a filament electrode, or the like is used. The acceleration mechanism includes electrodes such as an extraction electrode, an acceleration electrode, a deceleration electrode, and a ground electrode. These electrodes included in the acceleration mechanism are provided with a plurality of openings or slits, through which ions that are generated from the ion source are accelerated. Note that components of the ion doping apparatus are not limited to those described above and may be changed as needed.

In this embodiment, description is made of a case where the semiconductor substrate 100 is irradiated with ion beams including all of the ion species that are generated such that a plasma source gas is plasma excited using the ion doping apparatus. A hydrogen-containing gas such as $H_2$ is supplied as a plasma source gas. A hydrogen gas is excited to generate plasma; ions included in the plasma are accelerated without mass separation; and the semiconductor substrate 100 is irradiated with the accelerated ions.

In the above ion beam irradiation treatment, the percentage of $H_3^+$ ions to the total amount of ion species ($H^+$, $H_2^+$, and $H_3^+$) that are generated from a hydrogen gas is set to 50% or higher. Preferably, the percentage of $H_3^+$ ions is set to 80% or higher.

This is because increase in the percentage of $H_3^+$ ions in plasma enables the semiconductor substrate 100 to be irradiated with hydrogen ions efficiently. Note that the mass of an $H_3^+$ ion is three times as large as that of an $H^+$ ion; therefore, when one hydrogen atom is added to the same depth, the acceleration voltage for an $H_3^+$ ion can be three times as high as that of an $H^+$ ion. From the above reason, the taken time in the ion irradiation step can be shortened, and productivity and throughput can be improved. By irradiation with ions having the same mass, ions can be added in a concentrated manner to the same depth in the semiconductor substrate 100.

Ion doping apparatuses are inexpensive and excellent for use in large-area treatment. Therefore, by irradiation with $H_3^+$ by use of such an ion doping apparatus, significant effects such as an improvement in semiconductor characteristics, an increase in area, a reduction in costs, and an improvement in production efficiency can be obtained. Further, in the case where an ion doping apparatus is used, heavy metal may also be introduced at the time of the ion irradiation; however, by irradiation with ions through the insulating layer 123 containing chlorine atoms, the semiconductor substrate 100 can be prevented from being contaminated by the heavy metal.

Further, the embrittlement region 104 may be formed by ion implantation treatment using an ion implantation apparatus. The ion implantation apparatus is a mass-separation apparatus with which an object disposed in a chamber is irradiated with an ion beam having a specific ion spices after mass separation of plural kinds of ion species generated by excitation of a source gas into plasma. In the case of using an ion implantation apparatus, $H^+$ ions, $H_2^+$ ions, and $H_3^+$ ions which are generated by excitation of a hydrogen gas or $PH_3$ are mass-separated, and the semiconductor substrate 100 is irradiated with any of these ions.

With an ion implantation apparatus, the semiconductor substrate 100 can be irradiated with ion beams of one kind of ions and ions can be added to the same depth in the semiconductor substrate 100 in a concentrated manner. Therefore, in the profile of the added ions in a depth direction, the peak can be sharpened, and thus the surface planarity of the semiconductor layer to be separated can be easily increased. Moreover, the ion implantation apparatus is preferable because, owing to its electrode structure, contamination by heavy metal is relatively low and thus deterioration of characteristics of the semiconductor layer can be suppressed.

Next, the semiconductor substrate 100 over which the insulating layer 123 is formed is cleaned. This cleaning step can be performed by ultrasonic cleaning with the use of pure water, by two-fluid jet cleaning with the use of pure water and nitrogen, or the like. The ultrasonic cleaning is preferably megahertz ultrasonic cleaning (megasonic cleaning) After the above ultrasonic cleaning or the two-fluid jet cleaning, the semiconductor substrate 100 may be further cleaned with ozone water. By the cleaning with ozone water, removal of organic substances and surface activation treatment for improving the hydrophilic property of a surface of the insulating layer 123 can be performed.

The surface activation treatment of the insulating layer 123 can be performed by irradiation treatment with an atomic beam or an ion beam, ultraviolet treatment, ozone treatment, plasma treatment, plasma treatment with bias application, or radical treatment instead of the cleaning with ozone water (see the step A-4 in FIG. 5). In the case of using an atomic beam or an ion beam, an inert gas neutral atom beam or an inert gas ion beam of argon or the like can be used.

Here, an example of the ozone treatment is described. For example, the ozone treatment can be performed on a surface of an object by irradiation with ultraviolet (UV) rays in an atmosphere containing oxygen. The ozone treatment in which irradiation with ultraviolet rays is performed in an atmosphere containing oxygen is also called UV ozone treatment, ultraviolet ozone treatment, or the like. In an atmosphere containing oxygen, irradiation with ultraviolet rays having a wavelength of less than 200 nm and ultraviolet rays having a wavelength of greater than or equal to 200 nm is performed, whereby ozone can be generated and singlet oxygen can be generated by ozone. In addition, irradiation with ultraviolet rays having a wavelength of less than 180 nm is performed, whereby ozone can be generated and singlet oxygen can be generated by ozone.

Examples of reactions which occur by performing irradiation with light having a wavelength of less than 200 nm and light having a wavelength of greater than or equal to 200 nm in an atmosphere containing oxygen are described below.

$$O_2 + h\nu_1(\lambda_1 \text{ nm}) \rightarrow O(^3P) + O(^3P) \qquad (1)$$

$$O(^3P) + O_2 \rightarrow O_3 \qquad (2)$$

$$O_3 + h\nu_2(\lambda_2 \text{ nm}) \rightarrow O(^1D) + O_2 \qquad (3)$$

In the reaction formula (1), by irradiation with light ($h\nu_1$) having a wavelength ($\lambda_1$ nm) of less than 200 nm in an atmosphere containing oxygen ($O_2$), oxygen atoms ($O(^3P)$) in a ground state are generated. Then, in the reaction formula (2), the oxygen atom in a ground state ($O(^3P)$) and oxygen ($O_2$) react with each other; accordingly, ozone ($O_3$) is generated. Then, in the reaction formula (3), irradiation with light ($h\nu_2$) having a wavelength ($\lambda_2$ nm) of greater than or equal to 200 nm in an atmosphere containing generated ozone ($O_3$) is performed to generate singlet oxygen $O(^1D)$ in an excited state. In an atmosphere containing oxygen, irradiation with light including a wavelength of less than 200 nm among ultraviolet rays is performed to generate ozone while irradiation with light including a wavelength of greater than or equal to 200 nm among ultraviolet rays is performed to generate singlet oxygen by decomposing ozone. The ozone treatment as described above, for example, can be performed by irradiation with light of a low-pressure mercury lamp ($\lambda_1$=185 nm, $\lambda_2$=254 nm) in an atmosphere containing oxygen.

In addition, examples of reactions which occur by performing irradiation with light including a wavelength of less than 180 nm in an atmosphere containing oxygen are described.

$$O_2 + h\nu_3(\lambda_3 \text{ nm}) \rightarrow O(^1D) + O(^3P) \quad (4)$$

$$O(^3P) + O_2 \rightarrow O_3 \quad (5)$$

$$O_3 + h\nu_3(\lambda_3 \text{ nm}) \rightarrow O(^1D) + O_2 \quad (6)$$

In the above reaction formula (4), irradiation with light ($h\nu_3$) having a wavelength ($\lambda_3$ nm) of less than 180 nm in an atmosphere containing oxygen ($O_2$) is performed to generate singlet oxygen $O(^1D)$ in an excited state and an oxygen atom ($O(^3P)$) in a ground state. Next, in the reaction formula (5), an oxygen atom ($O(^3P)$) in a ground state and oxygen ($O_2$) are reacted with each other to generate ozone ($O_3$). In the reaction formula (6), irradiation with light ($h\nu_3$) having a wavelength ($\lambda_3$ nm) of less than 180 nm in an atmosphere containing generated ozone ($O_3$) is performed to generate singlet oxygen in an excited state and oxygen. By irradiation with ultraviolet rays having a wavelength of less than 180 nm in an atmosphere containing oxygen, ozone is generated and the ozone or oxygen is decomposed to generate singlet oxygen. The ozone treatment described above, for example, can be performed by irradiation using a Xe excimer UV lamp ($\lambda_3$=172 nm) in an atmosphere containing oxygen.

Chemical bonding of an organic substance attached to a surface of an object is cleaved by irradiation with the light having a wavelength of less than 200 nm, and the organic substance attached to the surface of the object or the organic substance whose chemical bonding is cleaved can be removed by oxidative decomposition with ozone or singlet oxygen generated by ozone. By performing ozone treatment as described above, a hydrophilic property and purity of the surface of the object can be increased, and bonding can be favorably performed.

In an atmosphere containing oxygen, ozone is generated by performing irradiation with ultraviolet rays. Ozone is effective in removal of the organic substance attached to the surface of the object. In addition, singlet oxygen is effective in removal of the organic substance attached to the surface of the object as much as or more than ozone. Ozone and singlet oxygen are examples of oxygen in active states, and collectively referred to as active oxygen. As described with the above reaction formulae and the like, since there are reactions where ozone is generated in generating singlet oxygen or singlet oxygen is generated by ozone, here, such reactions including a reaction where singlet oxygen contributes are called ozone treatment for convenience.

Next, a process of preparing for bonding the base substrate 120 to the semiconductor substrate 100 is described. This process relates to treatment for the base substrate 120 and corresponds to Process B in FIG. 5.

First, the base substrate 120 is prepared (see the step B-1 in FIG. 5). As the base substrate 120, a variety of glass substrates used in the electronics industry, such as a substrate of aluminosilicate glass, barium borosilicate glass, or aluminoborosilicate glass; a quartz substrate; a ceramic substrate; a sapphire substrate; or the like can be used. In addition, as the base substrate 120, a single crystal semiconductor substrate (for example, a single crystal silicon substrate) or a polycrystalline semiconductor substrate (for example, a polycrystalline silicon substrate) may be used. For example, a polycrystalline silicon substrate has advantages of being less expensive than a single crystal silicon substrate and having higher heat resistance than a glass substrate.

In the case where a glass substrate is used as the base substrate 120, for example, a mother glass substrate which is developed for manufacturing liquid crystal panels is preferably used. As a mother glass substrate, substrates having the following sizes are known: the third generation (550 mm×650 mm), the 3.5-th generation (600 mm×720 mm), the fourth generation (680 mm×880 mm or 730 mm×920 mm), the fifth generation (1100 mm×1300 mm), the sixth generation (1500 mm×1850 mm), the seventh generation (1870 mm×2200 mm), the eighth generation (2200 mm×2400 mm), the ninth generation (2400 mm×2800 mm), the tenth generation (2850 mm×3050 mm), and the like. By manufacturing an SOI substrate with the use of a large-sized mother glass substrate as the base substrate 120, the SOI substrate can have a large area. Increase in the area of the SOI substrate allows a plurality of ICs to be manufactured all at once, and thus the number of semiconductor devices manufactured from one substrate is increased; therefore, productivity can be dramatically increased.

Further, an insulating layer 122 is preferably formed over the base substrate 120 (see the step B-2 in FIG. 5). Needless to say, the insulating layer 122 is not necessarily provided over the base substrate 120; however, by forming a silicon nitride film, a silicon nitride oxide film, an aluminum nitride film, an aluminum nitride oxide film, or the like, which functions as a barrier film, over the base substrate 120 as the insulating layer 122 for example, impurities such as alkali metal or alkaline earth metal in the base substrate 120 can be prevented from entering the semiconductor substrate 100.

Since the insulating layer 122 is used as a bonding layer, a surface of the insulating layer 122 is preferably planarized in order to avoid defective bonding. Specifically, the insulating layer 122 is formed to have an average surface roughness (Ra) of 0.50 nm or less and a root-mean-square roughness (Rms) of 0.60 nm or less, preferably, an average surface roughness of 0.35 nm or less and a root-mean-square roughness of 0.45 nm or less. The thickness can be set as appropriate in the range of greater than or equal to 10 nm and less than or equal to 200 nm, preferably greater than or equal to 50 nm and less than or equal to 100 nm.

A surface of the base substrate 120 is cleaned before the bonding. The surface of the base substrate 120 can be cleaned with hydrochloric acid and hydrogen peroxide water or by megahertz ultrasonic cleaning, two-fluid jet cleaning, cleaning with ozone water, or the like. In a manner similar to that of the insulating layer 123, surface activation treatment such as irradiation treatment with an atomic beam or an ion beam, ultraviolet treatment, ozone treatment, plasma treatment, plasma treatment with bias application, or radical treatment is preferably performed on the surface of the insulating layer 122 before the bonding (see the step B-3 in FIG. 5).

Next, a process of bonding the semiconductor substrate 100 to the base substrate 120 and separating the semiconductor substrate 100 into the semiconductor layer 124 and the semiconductor substrate 121 is described. This process corresponds to Process C in FIG. 5.

Figure 4A:
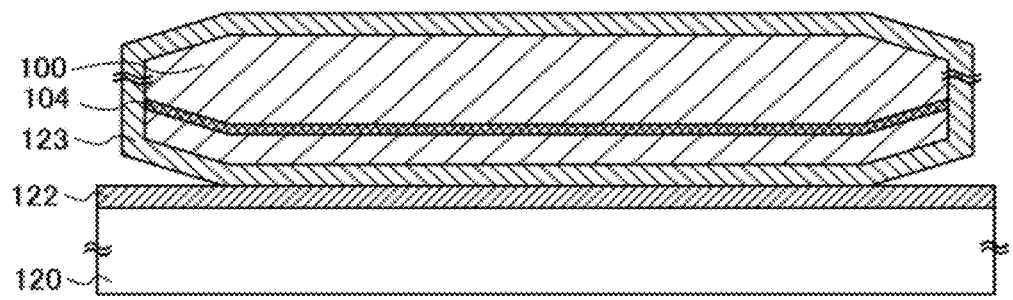
FIGS. 4A to 4C are cross-sectional views illustrating a method for manufacturing an SOI substrate.

First, the semiconductor substrate 100 processed through the above process is bonded to the base substrate 120 (see FIG. 4A and the step C-1 in FIG. 5). Here, the semiconductor substrate 100 and the base substrate 120 are bonded to each other with the insulating layer 123 and the insulating layer 122 provided therebetween; however, this embodiment is not limited to this structure in the case where the insulating layers are not formed.

The bonding can be realized by applying pressure of about 0.1 N/cm$^2$ to 500 N/cm$^2$, preferably about 1 N/cm$^2$ to 20 N/cm$^2$ to one part at an end of the base substrate 120. The bonding between the semiconductor substrate 100 and the base substrate 120 starts from the portion of the base substrate 120 to which the pressure is applied and spreads spontaneously to the entire surface. In this manner, the bonding between the base substrate 120 and the semiconductor substrate 100 is completed. This bonding is based on a principle of the Van der Waals force or the like, and strong bonding can be achieved even at room temperature.

Note that a region called an edge roll off region exists in a periphery of the semiconductor substrate 100. In the edge roll off region, the semiconductor substrate 100 (the insulating layer 123) is not in contact with the base substrate 120 (the insulating layer 122) in some cases. Also in a chamfer portion which exists outside the edge roll off region (on an end side of the semiconductor substrate 100), the base substrate 120 and the semiconductor substrate 100 are not in contact with each other.

In the CMP method used for manufacturing the semiconductor substrate 100, owing to its principle, polishing tends to progress in the periphery of the semiconductor substrate at higher speed than in a central portion thereof. Accordingly, in the periphery of the semiconductor substrate 100, a region where the thickness of the semiconductor substrate 100 is smaller than that in the central portion (an edge roll off region) is formed. Even in the case where an end portion of the semiconductor substrate 100 is not chamfered, bonding with the base substrate 120 is not performed in such an edge roll off region in some cases.

In the case where a plurality of semiconductor substrates 100 are bonded to one base substrate 120, pressure is preferably applied to each of the semiconductor substrates 100. This is because a semiconductor substrate 100 which is not in contact with the base substrate 120 may be formed due to differences in the thickness of the semiconductor substrates 100. Note that even in the case where there are slight differences in the thickness of the semiconductor substrates 100, bonding can be favorably performed when the semiconductor substrates 100 can be closely attached to the base substrate 120 owing to bend of the base substrate 120 or the like; therefore, this embodiment is not limited thereto.

After the semiconductor substrate 100 is bonded to the base substrate 120, heat treatment for increasing the bonding strength is preferably performed (see the step C-2 in FIG. 5). The temperature of the heat treatment is preferably set to a temperature at which a crack is not caused in the embrittlement region 104, for example, higher than or equal to 200° C. and lower than or equal to 450° C. Alternatively, when the semiconductor substrate 100 is bonded to the base substrate 120 while being heated in this temperature range, a similar effect can be obtained. Note that it is preferable that the above heat treatment be successively performed in an apparatus or a place where the bonding has been performed. This is for prevention of separation of the substrates owing to transportation thereof before the heat treatment.

Note that when a particle or the like is attached to the bonding surface in bonding the semiconductor substrate 100 to the base substrate 120, the portion where the particle or the like is attached is not bonded. In order to avoid attachment of a particle, the semiconductor substrate 100 and the base substrate 120 are preferably bonded in a treatment chamber where airtightness is secured. At the time of bonding the semiconductor substrate 100 to the base substrate 120, the process chamber may be in a state of reduced pressure (e.g., approximately 5.0×10$^{-3}$ Pa) so that the atmosphere of the bonding treatment is cleaned.

Figure 4B:
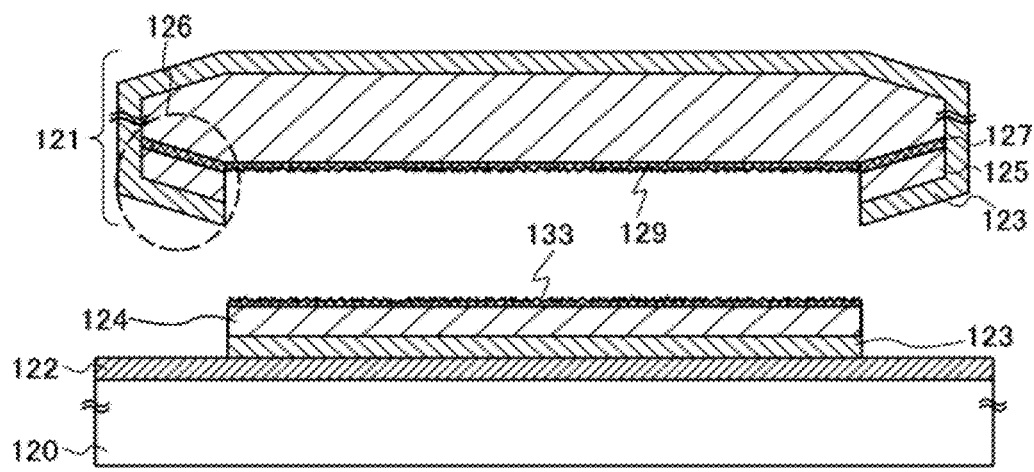
Figure 4C:
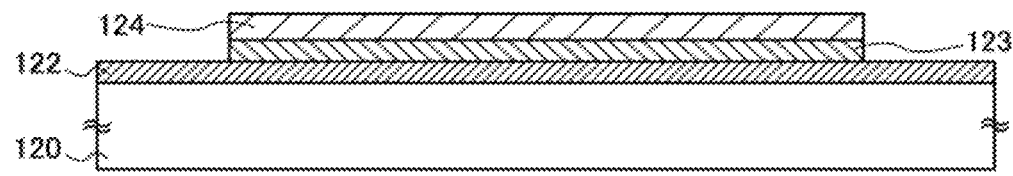

Next, heat treatment is performed so that the semiconductor substrate 100 is separated along the embrittlement region 104, and thus the semiconductor layer 124 is formed over the base substrate 120 while the semiconductor substrate 121 is formed (see FIG. 4B and the step C-3 in FIG. 5). Since the semiconductor substrate 100 and the base substrate 120 are bonded to each other in a region other than the edge roll off region and the chamfer portion, the semiconductor layer 124 which is separated from the semiconductor substrate 100 is fixed over the base substrate 120.

Here, the heat treatment for separating the semiconductor layer 124 is performed at a temperature below the strain point of the base substrate 120. This heat treatment can be performed using a rapid thermal anneal (RTA) apparatus, a resistance heating furnace, a microwave heating apparatus, or the like. Examples of RTA apparatuses include a gas rapid thermal anneal (GRTA) apparatus, a lamp rapid thermal anneal (LRTA) apparatus, and the like. In the case of using a GRTA apparatus, the temperature can be set at higher than or equal to 550° C. and lower than or equal to 650° C., and the treatment time can be set to longer than or equal to 0.5 minute and shorter than or equal to 60 minutes. In the case of using a resistance heating furnace, the temperature can be set at higher than or equal to 200° C. and lower than or equal to 650° C., and the treatment time can be set to longer than or equal to 2 hours and shorter than or equal to 4 hours.

Further, the above heat treatment may be performed by irradiation with a microwave or the like. As a specific example, the semiconductor substrate 100 can be separated by being irradiated with a 2.45 GHz of microwave at 900 W for approximately 5 minutes to 30 minutes.

In interfaces along which the semiconductor layer 124 and the semiconductor substrate 121 have been separated, the semiconductor region 129 and a semiconductor region 133 which are damaged by the ion beam irradiation treatment are left. The regions correspond to the embrittlement region 104 before the separation. Therefore, the semiconductor region 129 and the semiconductor region 133 include a large amount of hydrogen, crystal defects, and voids.

Further, the projection 126 exists in a region of the semiconductor substrate 121, in which the bonding is not performed (specifically a region corresponding to the edge roll off region and the chamfer portion of the semiconductor substrate 100). The projection 126 includes the semiconductor region 127 to which ions are added, the unseparated semiconductor region 125, and the insulating layer 123. The semiconductor region 127, as well as the semiconductor region 129 and the like, has been part of the embrittlement region 104, and thus includes a large amount of hydrogen, crystal defects, and voids. In addition, the semiconductor region 125 includes less hydrogen than the semiconductor region 127 or the like but includes crystal defects due to irradiation with ions or the like.

Next, a process of planarizing a surface of the semiconductor layer 124 which is bonded to the base substrate 120 to recover crystallinity is described. This process corresponds to Process D in FIG. 5.

The semiconductor region 133 over the semiconductor layer 124 which is closely attached to the base substrate 120 has crystal defects and the planarity is lowered owing to formation of the embrittlement region 104 and separation of the semiconductor substrate 100 along the embrittlement region 104. Therefore, the semiconductor region 133 may be removed by polishing or the like so that the surface of the semiconductor layer 124 is planarized (see FIG. 4C and the step D-1 in FIG. 5). The planarization is not necessarily performed; however, the planarization enables improvement in characteristics of an interface between the semiconductor layer and a layer (e.g., an insulating layer) formed on a surface of the semiconductor layer in a later step. Specifically, polishing can be performed by a CMP method, a liquid jet polishing method, or the like. Here, simultaneously with the removal of the semiconductor region 133, the semiconductor layer 124 is polished to be a thin film in some cases.

Further, the semiconductor region 133 can be removed by etching so that the semiconductor layer 124 is planarized. The above etching can be performed by a dry etching method such as a reactive ion etching (RIE) method, an inductively coupled plasma (ICP) etching method, an electron cyclotron resonance (ECR) etching method, a parallel plate (capacitively coupled) etching method, a magnetron plasma etching method, a dual-frequency plasma etching method, or a helicon wave plasma etching method. Note that both the polishing and the etching may be employed so that the semiconductor region 133 is removed and the surface of the semiconductor layer 124 is planarized.

Furthermore, by the polishing and the etching, in addition to the planarization of the surface of the semiconductor layer 124, the semiconductor layer 124 can be reduced in thickness so as to have a thickness which is suitable for the semiconductor element that is formed later.

Laser beam irradiation may be performed on the semiconductor region 133 and the semiconductor layer 124 in order to reduce crystal defects and improve the planarity (see the step D-2 in FIG. 5).

In the case where the semiconductor region 133 is removed and the surface of the semiconductor layer 124 is planarized by dry etching before the laser beam irradiation, defects might occur in the vicinity of the surface of the semiconductor layer 124. However, by the above laser beam irradiation, such defects can be repaired.

Since increase in the temperature of the base substrate 120 can be suppressed in the laser beam irradiation step, a substrate having low heat resistance can be used as the base substrate 120. It is preferable that the semiconductor region 133 be completely melted and the semiconductor layer 124 be partially melted by the laser beam irradiation. This is because when the semiconductor layer 124 is completely melted, recrystallization of the semiconductor layer 124 is accompanied by disordered nucleation of the semiconductor layer 124 in a liquid phase and the crystallinity of the semiconductor layer 124 is lowered. By partially melting the semiconductor layer 124, crystal growth progresses from a solid phase portion which is not melted; thus, crystal defects in the semiconductor layer 124 are reduced and the crystallinity is recovered. Note that complete melting of the semiconductor layer 124 indicates that the semiconductor layer 124 is melted up to the interface between the semiconductor layer 124 and the insulating layer 123 to be in a liquid state. On the other hand, partial melting of the semiconductor layer 124 indicates that part of the semiconductor layer 124 (here an upper layer) is melted to be in a liquid phase while another part thereof (here a lower layer) remains in a solid phase.

Next, after the laser beam irradiation, the surface of the semiconductor layer 124 may be etched. In this case, before the laser beam irradiation, the semiconductor region 133 may be etched or may not be etched. By this etching, the surface of the semiconductor layer 124 is planarized, and the semiconductor layer 124 can be reduced in thickness so as to have a thickness which is suitable for the semiconductor element that is completed later.

After the laser beam irradiation, the semiconductor layer 124 is preferably subjected to heat treatment at higher than or equal to 500° C. and lower than or equal to 650° C. (see the step D-3 in FIG. 5). By this heat treatment, defects in the semiconductor layer 124 can be further reduced and distortion of the semiconductor layer 124 can be alleviated. For the heat treatment, a rapid thermal anneal (RTA) apparatus, a resistance heating furnace, a microwave heating apparatus, or the like can be used. Examples of RTA apparatuses include a gas rapid thermal anneal (GRTA) apparatus, a lamp rapid thermal anneal (LRTA) apparatus, and the like. For example, when a resistance heating furnace is used, the heat treatment may be performed approximately at 600° C. for 4 hours.

When the SOI substrate obtained through the above process is used for a subsequent process of manufacturing a semiconductor device, various kinds of semiconductor devices can be manufactured (see Process F in FIG. 5).

<Reprocessing Treatment for Semiconductor Substrate>

Next, a process of performing reprocessing treatment on the semiconductor substrate 121 and manufacturing a reprocessed semiconductor substrate is described. This process corresponds to Process E in FIG. 5. Note that Embodiment 1 can be referred to for details of this process.

In the above manner, the semiconductor substrate 121 is reprocessed into the reprocessed semiconductor substrate 132. The obtained reprocessed semiconductor substrate 132 can be reused as the semiconductor substrate 100 in Process A.

As shown in this embodiment, the semiconductor substrate processed through the reprocessing treatment process is repeatedly used, whereby manufacturing cost for an SOI substrate can be reduced. In particular, when the method described in this embodiment or the like is employed, a damaged semiconductor region can be selectively removed. Therefore, the amount of the semiconductor substrate removed by the reprocessing treatment can be sufficiently controlled.

The structure described in this embodiment can be used in appropriate combination with the structure described in any of the other embodiments.

Embodiment 3

In this embodiment, the case where an SOI substrate is manufactured using a silicon substrate or the like with high heat resistance as a base substrate will be described. Note that a method described in this embodiment is common to the above embodiment in many points. Therefore, different points will be mainly described in this embodiment. Drawings will not be particularly shown in this embodiment because drawings of this embodiment are in common with those of the above embodiment.

In a semiconductor substrate that is used as a bond substrate, an insulating layer and an embrittlement region are formed (corresponding to Process A in FIG. 5). Treatment and the like for the semiconductor substrate, which includes the formation of the insulating layer and the embrittlement region, are similar to those in the above embodiment. Therefore, description in the above embodiment may be referred to for such treatment and the like.

In this embodiment, a substrate with high heat resistance is used as a base substrate (corresponding to Process B in FIG. 5). Examples of a substrate with high heat resistance include a quartz substrate, a sapphire substrate, a semiconductor substrate (e.g., a single crystal silicon substrate or a polycrystalline silicon substrate), and the like. In this embodiment, the case where a single crystal silicon substrate is used as the base substrate is described.

A typical example of a single crystal silicon substrate is a circular substrate which is 5 inches (125 mm) in diameter, 6 inches (150 mm) in diameter, 8 inches (200 mm) in diameter, 12 inches (300 mm) in diameter, or 16 inches (400 mm) in diameter. Note that the shape is not limited to the circular shape, and a silicon substrate which is processed into a rectangular shape or the like can also be used. In the description given below, the case where a rectangular single crystal silicon substrate is used as the base substrate is described. Note that the size of the base substrate may be substantially the same as or different from that of the bond substrate.

Note that a surface of the base substrate is preferably cleaned using a sulfuric acid/hydrogen peroxide mixture (SPM), an ammonium hydroxide/hydrogen peroxide mixture (APM), a hydrochloric acid/hydrogen peroxide mixture (HPM), dilute hydrofluoric acid (DHF), ozone water, or the like, as appropriate. Further, diluted hydrofluoric acid and ozone water may be discharged alternately to clean the surface of the semiconductor substrate 100.

An insulating layer may be formed over the base substrate. In the case where an insulating layer is formed over the base substrate, an insulating layer on the bond substrate side can be omitted. The insulating layer may be formed using a single insulating film or a stacked layer including a plurality of insulating films. The insulating layer can be formed using an insulating film which contains silicon as a component, such as a silicon oxide film, a silicon nitride film, a silicon oxynitride film, or a silicon nitride oxide film.

For example, the above insulating layer can be formed by thermal oxidation treatment. Although dry oxidation is preferably employed as the thermal oxidation treatment, the thermal oxidation treatment may be performed under an oxidation atmosphere to which a halogen-containing gas is added. As the halogen-containing gas, one or plural kinds of gases selected from HCl, HF, $NF_3$, HBr, $Cl_2$, $ClF_3$, $BCl_3$, $F_2$, $Br_2$, and the like can be used The surface of the base substrate is cleaned before bonding. The surface of the base substrate can be cleaned with hydrochloric acid and hydrogen peroxide water or by megahertz ultrasonic cleaning, two-fluid jet cleaning, cleaning with ozone water, or the like. Further, the bonding may be performed after the surface is subjected to surface activation treatment such as irradiation treatment with an atomic beam or an ion beam, ultraviolet treatment, ozone treatment, plasma treatment, plasma treatment with bias application, or radical treatment.

Next, the semiconductor substrate (the bond substrate) and the base substrate are bonded to each other, and the semiconductor substrate is separated (corresponding to Process C in FIG. 5). Accordingly, a semiconductor layer is formed over the base substrate. The above embodiment can be referred to for details of this process.

In this embodiment, the single crystal silicon substrate with high heat resistance is used as the base substrate. Therefore, the upper limit of the temperature of all kind of heat treatment can be raised up to the vicinity of a melting point of the single crystal silicon substrate.

For example, the upper limit of the temperature of heat treatment for separating the semiconductor substrate can be set at approximately 1200° C. When the temperature of the heat treatment is set at 700° C. or higher, bonding strength with the base substrate can be further increased.

Next, a surface of the semiconductor layer bonded to the base substrate is planarized, and the crystallinity is recovered (corresponding to Process D in FIG. 5).

In the semiconductor layer which is closely attached to the base substrate, crystal defects due to formation of the embrittlement region and separation of the semiconductor substrate along the embrittlement region are formed, and the planarity of the semiconductor layer is lowered. Therefore, heat treatment is preferably performed to reduce the crystal defects and to improve the planarity of the surface. The heat treatment is preferably performed under the temperature condition of 800° C. to 1300° C., typically 850° C. to 1200° C. When heat treatment is performed under such a relatively high temperature condition, crystal defects can be sufficiently reduced and the planarity of the surface can be improved.

For the heat treatment, a rapid thermal anneal (RTA) apparatus, a resistance heating furnace, a microwave heating apparatus, or the like can be used. For example, in the case where a resistance heating furnace is used, the heat treatment may be performed approximately at 950° C. to 1150° C. for 1 minute to 4 hours. Note that the heat treatment for separating the semiconductor substrate, if performed at higher temperature, can be performed instead of this heat treatment.

The semiconductor layer may be irradiated with a laser beam before or after the heat treatment. By the laser beam irradiation, crystal defects that cannot be repaired by the heat treatment can be repaired. The above embodiment can be referred to for details of the laser beam irradiation.

In addition, before or after the heat treatment, a semiconductor region in an upper portion of the semiconductor layer may be removed by polishing or the like so that the surface thereof is planarized. By this planarization treatment, the surface of the semiconductor layer can be further planarized. Specifically, the polishing may be chemical mechanical polishing (CMP), liquid jet polishing, or the like. Note that the semiconductor layer may be reduced in thickness by this treatment in some cases.

Alternatively, the semiconductor region in the upper portion of the semiconductor layer can be removed by etching so that the surface thereof is planarized. The above etching can be performed by a dry etching method such as a reactive ion etching (RIE) method, an inductively coupled plasma (ICP) etching method, an electron cyclotron resonance (ECR) etching method, a parallel plate (capacitively coupled) etching method, a magnetron plasma etching method, a dual-frequency plasma etching method, or a helicon wave plasma etching method. Note that both the polishing and the etching may be used for the planarization.

Furthermore, by the polishing and the etching, in addition to the planarization of the surface of the semiconductor layer, the semiconductor layer can be reduced in thickness so as to have a thickness which is suitable for the semiconductor element that is completed later.

When the SOI substrate obtained through the above process is used for a subsequent process of manufacturing a semiconductor device, various kinds of semiconductor devices can be manufactured.

Next, a process of performing reprocessing treatment on the semiconductor substrate 121 and manufacturing a reprocessed semiconductor substrate is described (corresponding to Process E in FIG. 5). The above embodiment can be referred to for details of reprocessing treatment.

As shown in this embodiment, the semiconductor substrate processed through the reprocessing treatment process is repeatedly used, whereby manufacturing cost for an SOI substrate can be reduced. In particular, by employing such heat treatment at high temperature as shown in this embodiment, an SOI substrate having favorable characteristics can be manufactured even when there remain slightly a few defects in the bond substrate.

The structure described in this embodiment can be used in appropriate combination with the structure described in any of the other embodiments.

Embodiment 4

Figure 6:
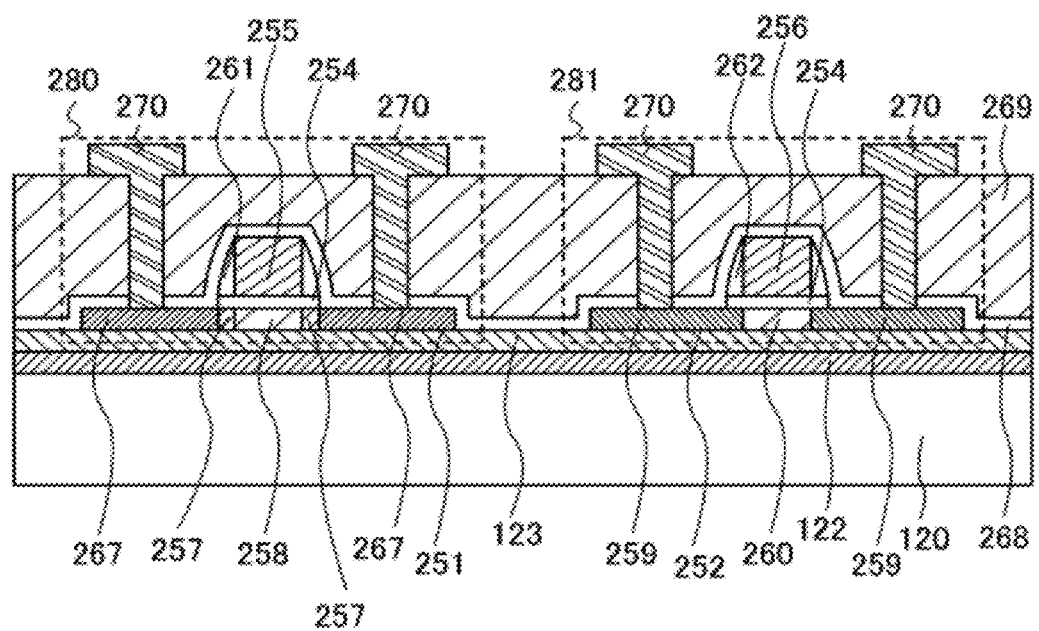
FIG. 6 is a cross-sectional view illustrating a semiconductor device which includes an SOI substrate.

An example of a semiconductor device which includes the SOI substrate manufactured in any of the above embodiments is illustrated in FIG. 6.

FIG. 6 illustrates an example of a semiconductor device including a transistor 280 which is an n-channel thin film transistor and a transistor 281 which is a p-channel thin film transistor. The transistor 280 and the transistor 281 are formed over the base substrate 120 with the insulating layer 123 and the insulating layer 122 provided therebetween. Various kinds of semiconductor devices can be formed by combining such a plurality of thin film transistors (TFTs). A method for manufacturing the semiconductor device illustrated in FIG. 6 will be described below.

First, an SOI substrate is prepared. As the SOI substrate, the SOI substrate manufactured in either of the above embodiments can be used.

Next, a semiconductor layer is etched to be divided into an island-shaped semiconductor layer 251 and an island-shaped semiconductor layer 252. The semiconductor layer 251 is included in an n-channel TFT, and the semiconductor layer 252 is included in a p-channel TFT.

An insulating layer 254 is formed over the semiconductor layer 251 and the semiconductor layer 252, and then a gate electrode 255 and a gate electrode 256 are respectively formed over the semiconductor layer 251 and the semiconductor layer 252 with the insulating layer 254 provided therebetween.

In order to control threshold voltage of the TFTs, it is preferable to add an impurity element which serves as an acceptor, such as boron, aluminum, or gallium, or an impurity element which serves as a donor, such as phosphorus or arsenic, to the semiconductor layers. For example, an impurity element which serves as an acceptor is added into a region where an n-channel TFT is to be formed, and an impurity element which serves as a donor is added to a region where a p-channel TFT is to be formed.

Next, an n-type low-concentration impurity region 257 is formed in the semiconductor layer 251, and a p-type high-concentration impurity region 259 is formed in the semiconductor layer 252. Specifically, first, the semiconductor layer 252 used for the p-channel TFT is covered with a resist mask and an impurity element is added to the semiconductor layer 251, so that the n-type low-concentration impurity region 257 is formed in the semiconductor layer 251. Phosphorus or arsenic may be added as the impurity element. The gate electrode 255 serves as a mask, whereby the n-type low-concentration impurity region 257 is formed in the semiconductor layer 251 in a self-aligned manner. Further, a region of the semiconductor layer 251, which overlaps with the gate electrode 255, serves as a channel formation region 258. Next, after the mask which covers the semiconductor layer 252 is removed, the semiconductor layer 251 where an n-channel TFT is to be formed is covered with a resist mask. Then, an impurity element is added to the semiconductor layer 252. Boron, aluminum, gallium, or the like may be added as the impurity element. Here, the gate electrode 256 functions as a mask, and the p-type high-concentration impurity region 259 is formed in the semiconductor layer 252 in a self-aligned manner. A region of the semiconductor layer 252 that overlaps with the gate electrode 256 serves as a channel formation region 260. Here, the method is described in which the p-type high-concentration impurity region 259 is formed after the n-type low-concentration impurity region 257 is formed; however, the p-type high-concentration impurity region 259 can be formed first.

Next, after the resist mask which covers the semiconductor layer 251 is removed, an insulating layer having a single-layer structure or a stacked structure, which includes a nitride such as silicon nitride or an oxide such as silicon oxide, is formed by a plasma CVD method or the like. This insulating layer is anisotropically etched in a perpendicular direction, whereby a sidewall insulating layer 261 and a sidewall insulating layer 262 are formed in contact with side surfaces of the gate electrode 255 and the gate electrode 256, respectively. Note that the insulating layer 254 is also etched by the above anisotropic etching.

Next, the semiconductor layer 252 is covered with a resist mask, and an impurity element is added to the semiconductor layer 251 at a high dose. By this treatment, the gate electrode 255 and the sidewall insulating layer 261 serve as masks, and an n-type high-concentration impurity region 267 is formed.

After activation treatment (heat treatment) of the impurity elements, an insulating layer 268 containing hydrogen is formed. After the formation of the insulating layer 268, heat treatment is performed at higher than or equal to 350° C. and lower than or equal to 450° C., whereby hydrogen contained in the insulating layer 268 is diffused into the semiconductor layer 251 and the semiconductor layer 252. The insulating layer 268 can be formed by deposition of silicon nitride or silicon nitride oxide by a plasma CVD method at a process temperature of 350° C. or lower. By supplying hydrogen to the semiconductor layer 251 and the semiconductor layer 252, defects which serve as trapping centers in the semiconductor layer 251, the semiconductor layer 252, or at the interfaces between the semiconductor layers and the insulating layer 254 can be repaired effectively.

After that, an interlayer insulating layer 269 is formed. The interlayer insulating layer 269 can be formed to have a single-layer structure or a stacked structure including an insulating film containing an inorganic material such as silicon oxide or boron phosphorus silicon glass (BPSG), or an insulating film containing an organic material such as polyimide or acrylic. After contact holes are formed in the interlayer insulating layer 269, wirings 270 are formed. For example, the wirings 270 can be formed using a conductive film with a three-layer structure in which a low-resistance metal film such as an aluminum film or an aluminum alloy film is sandwiched between barrier metal films. The barrier metal films can be formed using molybdenum, chromium, titanium, or the like.

Through the above process, a semiconductor device having the n-channel TFT and the p-channel TFT can be manufactured. The SOI substrate used for the semiconductor device of this embodiment is manufactured at extremely low cost, as described in the above embodiments. Accordingly, cost for manufacturing the semiconductor device can be reduced.

Note that the semiconductor device illustrated in FIG. 6 and a manufacturing method thereof are described in this embodiment; however, the structure of a semiconductor device of an embodiment of the invention to be disclosed is not limited thereto. The semiconductor device may include a capacitor, a resistor, a photoelectric conversion element, a light-emitting element, or the like in addition to a TFT.

Note that the structure described in this embodiment can be appropriately used in combination with a structure described in another embodiment.

EXAMPLE

In this example, in semiconductor substrates (bond substrates) after separation which are by-produced in manufacture of an SOI substrate, a remaining insulating film is removed, the semiconductor substrates are subjected to wet etching treatment, and the semiconductor substrates are subjected to the reprocessing treatment by a reprocessing method of a semiconductor substrate in an embodiment of the present invention. The results are shown below.

First, semiconductor substrates used in this example are described.

In this example, a rectangular single crystal silicon substrate with a size of 5 inches square was employed as the semiconductor substrates. First, thermal oxidation was performed on the semiconductor substrates in an HCl atmosphere to form a thermal oxide film with a thickness of 100 nm on a surface of each of the substrates. The thermal oxidation was performed at 950° C. for 4 hours in a thermal oxidation atmosphere where the rate of HCl to oxygen was 3 volume %.

Next, each of the semiconductor substrates was irradiated with ion beams through a surface of the thermal oxide film with the use of an ion doping apparatus. In this example, a hydrogen gas was excited to generate plasma; ions included in the plasma were accelerated without mass separation; and the accelerated ions were introduced into the semiconductor substrates, whereby an embrittlement region was formed in each of the semiconductor substrates. Conditions of ion doping were set such that the acceleration voltage was 50 kV and the dose was $2.7 \times 10^{16}$ ions/cm$^2$.

Then, each of the semiconductor substrates was bonded to a glass substrate with the thermal oxide film provided therebetween. After that, heat treatment at 200° C. for 120 minutes and then heat treatment at 600° C. for 120 minutes were performed, so that a thin film single crystal silicon layer was separated from each of the semiconductor substrates along the embrittlement region. Accordingly, SOI substrates were manufactured, and at the same time, semiconductor substrates each having a projection in a peripheral portion thereof were formed.

Next, treatment performed on the above semiconductor substrates is described.

First, in order to remove an insulating layer which was formed to cover each of the semiconductor substrates, the semiconductor substrates were subjected to wet etching treatment using a 5% hydrofluoric acid solution. At this time, the solution temperature was room temperature and the etching time was 180 seconds.

Next, the semiconductor substrates from which the insulating layer had been removed were subjected to wet etching treatment using, as an etchant, a mixed solution in which hydrofluoric acid, nitric acid, and acetic acid were mixed at a volume ratio of 1:2:10. When concentration of nitrous acid in the etchant used in this example was evaluated with a semi-quantitative ion test strips (QUANTOFIX Nitrite and Nitrite 3000), the concentration was 80 mg/l to 100 mg/l. In the etchant used in this example, hydrofluoric acid at a concentration of 50 weight % (produced by Stella Chemifa Corporation); nitric acid at a concentration of 70 weight % (produced by Wako Pure Chemical Industries, Ltd.); and acetic acid at a concentration of 97.7 weight % (produced by Kishida Chemical Co., Ltd.) were used. Further, the solution temperature of the etchant was set to 30° C., and the etching time was set to any of 15 seconds, 30 seconds, 45 seconds, 60 seconds, 75 seconds, 90 seconds, 105 seconds, 120 seconds, 135 seconds, and 180 seconds.

Ten kinds of reprocessed semiconductor substrates manufactured by the above methods were observed with a magic mirror system and with an optical microscope.

In this example, the magic mirror system was the magic mirror system MIS-2000Z (produced by KOBELCO Research Institute, Inc.), and observed images were taken. The magic mirror system is an apparatus used to detect minute unevenness on a surface which is not easily visible even at close range. The patterns are detected by the application of the principle of the magic mirror: when the minute unevenness are carved on the surface of a mirror and light is reflected so that an image is formed at a distance increased by about several meters, the focal point starts to be blurred and seen as a pattern. With the principle of the magic mirror, invisible unevenness on a mirror-finished surface of a sample can be displayed as a dark image for the convex portion and the bright image for a concave portion. With the use of this apparatus, macro-level surface roughness, protuberance, concave, polishing dent, grinding marks, cracks, thermal slip, and the like on the surface of a substrate can be observed.

Further, in observation with an optical microscope, the peripheral portion of the substrate was photographed by an optical microscope, MX61L manufactured by Olympus Corporation. Note that the optical microphotographs were taken as a Nomarski image at 50-fold magnification.

Figure 7:
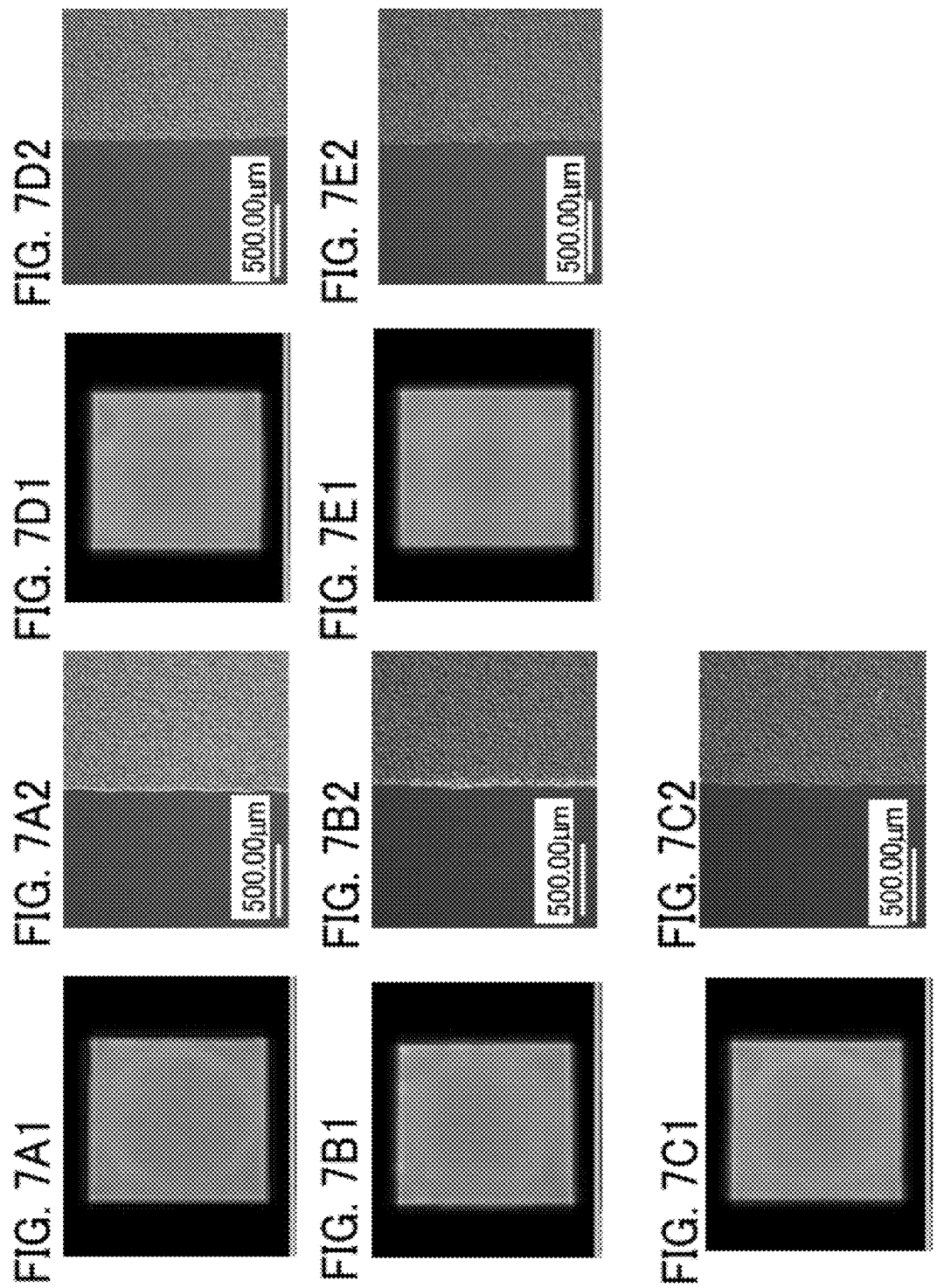
Figure 8:
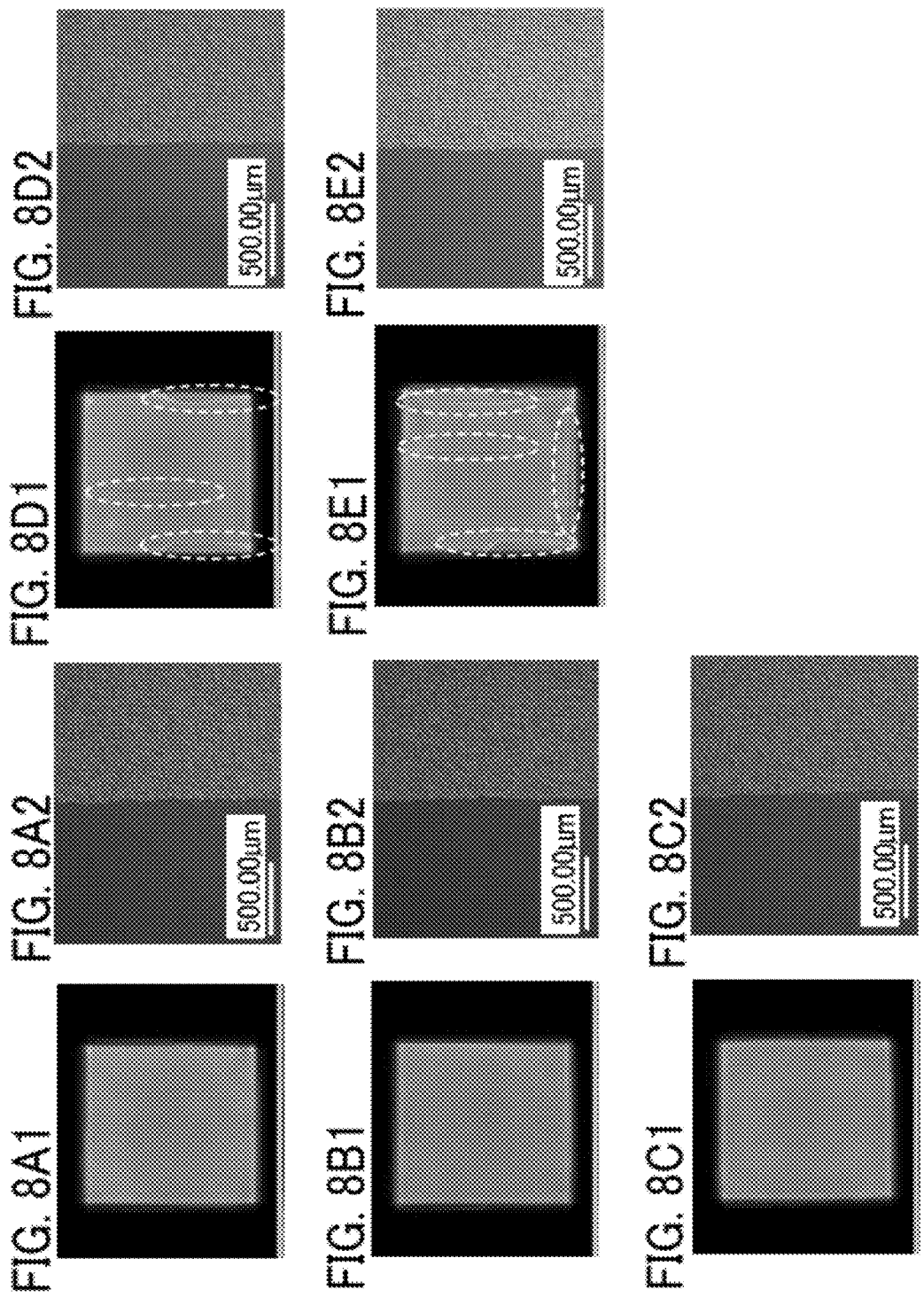

FIGS. 7A1, 7B1, 7C1, 7D1, and 7E1 and FIGS. 8A1, 8B1, 8C1, 8D1, and 8E1 are each an image of a reprocessed semiconductor substrate observed using the magic mirror system. Further, FIGS. 7A2, 7B2, 7C2, 7D2, and 7E2 and FIGS. 8A2, 8B2, 8C2, 8D2, and 8E2 are each an optical microscope photograph. FIGS. 7A1 and 7A2, 7B1 and 7B2, 7C1 and 7C2, 7D1 and 7D2, 7E1 and 7E2 are images of reprocessed semiconductor substrates which were subjected to the etchings for 15 seconds, 30 seconds, 45 seconds, 60 seconds, 75 seconds, respectively, in this order. FIGS. 8A1 and 8A2, 8B1 and 8B2, 8C1 and 8C2, 8D1 and 8D2, 8E1 and 8E2 are images of reprocessed semiconductor substrates which were subjected to the etchings for 90 seconds, 105 seconds, 120 seconds, 135 seconds, and 180 seconds, respectively, in this order. That is, FIG. 7A1 is an image of a reprocessed semiconductor substrate observed using the magic mirror system, which was subjected to the etching for 15 seconds and FIG. 7A2 is an image of the reprocessed semiconductor substrate observed using an optical microscope photograph, which was subjected to the etching for 15 seconds. FIG. 8A1 is an image of a reprocessed semiconductor substrate observed using the magic mirror system, which was subjected to the etching for 90 seconds and FIG. 8A2 is an image of the reprocessed semiconductor substrate observed using an optical microscope photograph, which was subjected to the etching for 90 seconds.

According to FIGS. 7A1, 7B1, 7C1, 7D1, and 7E1 and FIGS. 8A1, 8B1, 8C1, 8D1, and 8E1 in the reprocessed semiconductor substrate manufactured in this example, in the case where the etching time is set to 135 seconds or 180 seconds, a dark image is observed in a region circled by a dotted line and unevenness is observed over the surface of the reprocessed semiconductor substrate. On the other hand, in the reprocessed semiconductor substrate manufactured in this example, in the case where the etching time is set to 15 seconds to 120 seconds, there is little unevenness over the surface of the semiconductor substrate, and the planarity of the surface is improved.

On the right side in FIGS. 7A2, 7B2, 7C2, 7D2, and 7E2, and FIGS. 8A2, 8B2, 8C2, 8D2, and 8E2, the peripheral portion of the substrate is shown. In the reprocessed semiconductor substrate manufactured in this example, in the case where the etching time is 15 seconds, some remaining steps are observed, and in the case where the etching time is longer than or equal to 30 seconds, steps resulted from a remaining single crystal silicon layer having defects or the like were reduced.

Figure 9:
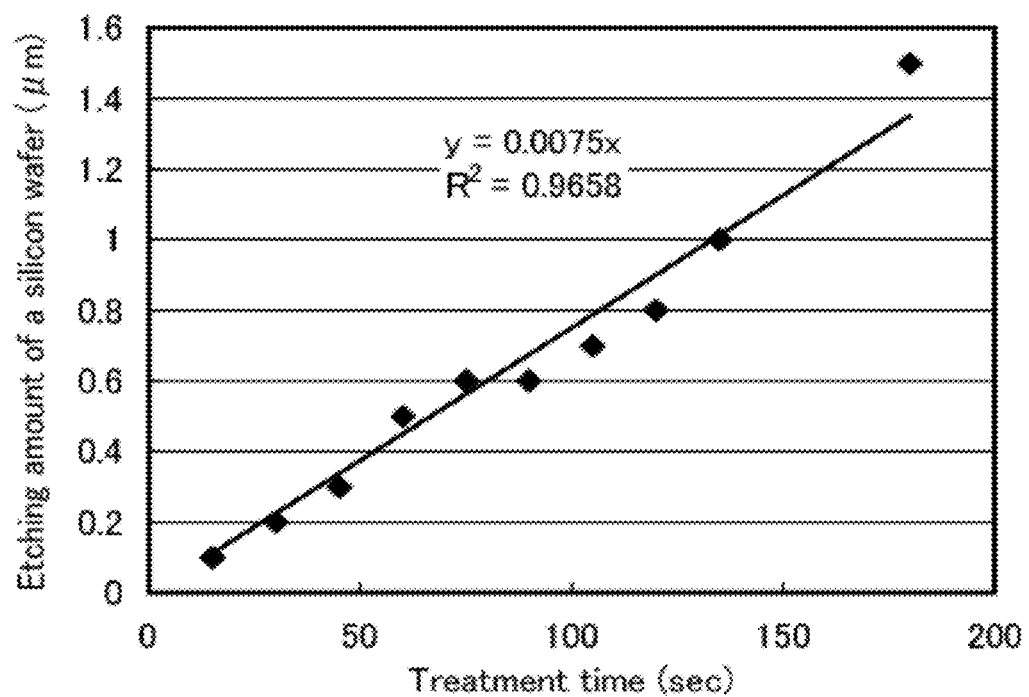
FIG. 9 is a graph showing a relation between an etching amount and etching time of Example.

In addition, in this example, the etching amount of a silicon wafer in the case where the etching time was set to 15 seconds, 30 seconds, 45 seconds, 60 seconds, 75 seconds, 90 seconds, 105 seconds, 120 seconds, 135 seconds, and 180 seconds was measured. FIG. 9 illustrates a relation between the etching time and the etching amount of the silicon wafer. In FIG. 9, the vertical axis represents the etching amount (μm) of the silicon substrate and the horizontal axis represents the etching time (second).

According to FIG. 9, it was confirmed that, in the etchant used in this example, the etching amount with respect to the etching time was increased linearly. Therefore, it is shown that a stable etching rate can be obtained by using the etchant in this example.

This application is based on Japanese Patent Application serial no. 2011-137283 filed with Japan Patent Office on Jun. 21, 2011, the entire contents of which are hereby incorporated by reference.

What is claimed is:

1. A reprocessing method of a silicon substrate, comprising the steps of:
    subjecting a silicon substrate in which a projection comprising a damaged silicon region and an insulating layer is provided in a peripheral portion to a first etching treatment for removing the insulating layer; and
    subjecting the silicon substrate to a second etching treatment for removing selectively the damaged silicon region with a non-damaged silicon region left,
    wherein the second etching treatment uses a mixed solution comprising:
        nitric acid;
        hydrofluoric acid;
        acetic acid; and
        nitrous acid,
    wherein a concentration of the nitrous acid in the mixed solution is higher than or equal to 10 mg/l and lower than or equal to 1000 mg/l, and
    wherein the mixed solution is prepared before the step of subjecting the silicon substrate to the second etching treatment.

2. The reprocessing method of a silicon substrate according to claim 1,
    wherein the concentration of the nitrous acid is higher than or equal to 50 mg/l and lower than or equal to 300 mg/l.

3. The reprocessing method of a silicon substrate according to claim 1,
    wherein the projection further comprising a first region corresponding to the edge roll off region and a second region corresponding to a chamfer portion,
    wherein the first region is located at a distance longer than or equal to 0.2 mm and shorter than or equal to 0.9 mm from the end of the silicon substrate, and
    wherein the second region is located at a distance shorter than 0.2 mm from the end of the silicon substrate.

4. The reprocessing method of a silicon substrate according to claim 1,
    wherein a temperature of the mixed solution is 10° C. to 40° C.

5. The reprocessing method of a silicon substrate according to claim 1,
    wherein a concentration of the hydrofluoric acid in the mixed solution is 50 weight %,
    wherein a concentration of the nitric acid in the mixed solution is 70 weight %,
    wherein a concentration of the acetic acid in the mixed solution is 97.7 weight %, and
    wherein a volume ratio of the mixed solution comprising the hydrofluoric acid, the nitric acid, and the acetic acid is approximately 1:2:10.

6. The reprocessing method of a silicon substrate according to claim 1,
    wherein an etching selectivity of the damaged silicon region to the non-damaged silicon region is 1.7 or higher in the second etching treatment.

7. A reprocessing method of a silicon substrate, comprising the steps of:
    separating a part of a silicon substrate as a silicon layer through irradiation with ions and heat treatment;
    subjecting the separated silicon substrate in which a projection including a damaged silicon region and an insulating layer remain in a peripheral portion to a first etching treatment for removing the insulating layer; and
    subjecting the separated silicon substrate to a second etching treatment for selectively removing the damaged silicon region with a non-damaged silicon region left,
    wherein the second etching treatment uses a mixed solution comprising:
        nitric acid;
        hydrofluoric acid;
        acetic acid, and
        nitrous acid,
    wherein a concentration of the nitrous acid in the mixed solution is higher than or equal to 10 mg/l and lower than or equal to 1000 mg/l, and
    wherein the mixed solution is prepared before the step of subjecting the silicon substrate to the second etching treatment.

8. The reprocessing method of a silicon substrate according to claim 7,
    wherein the irradiation with the ions is performed without mass separation.

9. The reprocessing method of a silicon substrate according to claim 7,
    wherein the ions include $H_3^+$.

10. The reprocessing method of a silicon substrate according to claim 7,
    wherein the concentration of the nitrous acid is higher than or equal to 50 mg/l and lower than or equal to 300 mg/l.

11. The reprocessing method of a silicon substrate according to claim 7,
    wherein the projection further comprising a first region corresponding to the edge roll off region and a second region corresponding to a chamfer portion,
    wherein the first region is located at a distance longer than or equal to 0.2 mm and shorter than or equal to 0.9 mm from the end of the separated silicon substrate, and
    wherein the second region is located at a distance shorter than 0.2 mm from the end of the separated silicon substrate.

12. The reprocessing method of a silicon substrate according to claim 7,
    wherein a temperature of the mixed solution is 10° C. to 40° C.

13. The reprocessing method of a silicon substrate according to claim 7,
    wherein a concentration of the hydrofluoric acid in the mixed solution is 50 weight %,
    wherein a concentration of the nitric acid in the mixed solution is 70 weight %, wherein a concentration of the acetic acid in the mixed solution is 97.7 weight %, and wherein a volume ratio of the mixed solution comprising the hydrofluoric acid, the nitric acid, and the acetic acid is approximately 1:2:10.

14. The reprocessing method of a silicon substrate according to claim 7, wherein an etching selectivity of the damaged silicon region to the non-damaged silicon region is 1.7 or higher in the second etching treatment.

15. The reprocessing method of a silicon substrate according to claim 1, wherein the silicon substrate after the step of subjecting the silicon substrate to the second etching treatment is used for a reprocessed silicon substrate.

16. The reprocessing method of a silicon substrate according to claim 7, wherein the silicon substrate after the step of subjecting the silicon substrate to the second etching treatment is used for a reprocessed silicon substrate.

17. The reprocessing method of a silicon substrate according to claim 1, wherein the mixed solution is prepared by subjecting a dummy substrate to wet etching treatment using a mixed solution which includes nitric acid, hydrofluoric acid, and acetic acid.

18. The reprocessing method of a silicon substrate according to claim 7, wherein the mixed solution is prepared by subjecting a dummy substrate to wet etching treatment using a mixed solution which includes nitric acid, hydrofluoric acid, and acetic acid.

\* \* \* \* \*